(12) United States Patent
Tsutsumi et al.

(10) Patent No.: US 8,314,203 B2
(45) Date of Patent: Nov. 20, 2012

(54) POLYIMIDE FILM

(75) Inventors: Masayuki Tsutsumi, Ohtsu (JP); Satoshi Maeda, Ohtsu (JP); Keizo Kawahara, Ohtsu (JP); Takefumi Yoshida, Ohtsu (JP); Kazutake Okamoto, Ohtsu (JP); Morio Morino, Ohtsu (JP); Shoichi Uemura, Ohtsu (JP); Akinobu Nagara, Ohtsu (JP); Noriko Takahashi, Ohtsu (JP); Hiroko Oyama, Ohtsu (JP); Shunji Kurahara, Ohtsu (JP); Jun Yasui, Ohtsu (JP)

(73) Assignee: Toyo Boseki Kabushiki Kaisha, Osaka-shi (JP)

( * ) Notice: Subject to any disclaimer, the term of this patent is extended or adjusted under 35 U.S.C. 154(b) by 1397 days.

(21) Appl. No.: 10/584,398

(22) PCT Filed: Dec. 27, 2004

(86) PCT No.: PCT/JP2004/019528
§ 371 (c)(1),
(2), (4) Date: Jul. 5, 2007

(87) PCT Pub. No.: WO2005/063860
PCT Pub. Date: Jul. 14, 2005

(65) Prior Publication Data
US 2007/0272124 A1    Nov. 29, 2007

(30) Foreign Application Priority Data

Dec. 26, 2003 (JP) ................ 2003-434160
Dec. 26, 2003 (JP) ................ 2003-435671
May 25, 2004 (JP) ................ 2004-155084
Sep. 1, 2004 (JP) ................ 2004-254049
Sep. 10, 2004 (JP) ................ 2004-263869

(51) Int. Cl.
*C08G 69/08*    (2006.01)
(52) U.S. Cl. ............................................. 528/310
(58) Field of Classification Search .............. 528/310
See application file for complete search history.

(56) References Cited

U.S. PATENT DOCUMENTS 3,966,686 A * 6/1976 Asakura et al. ............... 528/331
(Continued)

FOREIGN PATENT DOCUMENTS

CN    1183887    6/1998
(Continued)

OTHER PUBLICATIONS

International Search Report dated Mar. 1, 2005, directed to counterpart application No. PCT/JP2004/019528.
(Continued)

*Primary Examiner* — Randy Gulakowski
*Assistant Examiner* — Shane Fang
(74) *Attorney, Agent, or Firm* — Morrison & Foerster LLP

(57) ABSTRACT

This polyimide film is superior in heat resistance, rigidity and high frequency properties, is free of inconveniences due to curling even when various functional layers are laminated by heating, and is preferable as a substrate film superior in thermal degradation stability for electronic parts. This polyimide film has a planar orientation coefficient of 0.79-0.89 as measured by an X-ray diffraction method, a difference in the surface planar orientation degree between one surface thereof and the other surface thereof of not more than 2 and a curling degree of not more than 5%, which is obtained by imidation of a polyimide precursor film having a particular imidation rate.

17 Claims, 4 Drawing Sheets

U.S. PATENT DOCUMENTS

| | | | |
|---|---|---|---|
| 5,919,892 | A | 7/1999 | Hwang et al. |
| 6,143,399 | A | 11/2000 | Kohno et al. |

FOREIGN PATENT DOCUMENTS

| | | |
|---|---|---|
| JP | 05-237928 | 9/1993 |
| JP | 05-237928 A | 9/1993 |
| JP | 06-056922 A | 3/1994 |
| JP | 06-056992 | 3/1994 |
| JP | 10-508059 | 8/1998 |
| JP | 11-504369 | 4/1999 |
| JP | 11-504369 A | 4/1999 |
| JP | 11-505184 | 5/1999 |
| JP | 11-505184 A | 5/1999 |
| JP | 2000-085007 | 3/2000 |
| JP | 2000-085007 A | 3/2000 |
| JP | 2002-355832 | 12/2002 |
| JP | 2002-355832 A | 12/2002 |
| WO | WO-96/36204 | 11/1996 |
| WO | WO-97/44182 | 11/1997 |
| WO | WO-97/44182 A1 | 11/1997 |
| WO | WO-02/40256 A1 | 5/2002 |

OTHER PUBLICATIONS

European Search Report dated Feb. 20, 2007, directed at counterpart EP application No. 04807883.6.

Chinese Office Action issued Mar. 7, 2008, directed to counterpart CN application No. 200480038951.2; 9 pages.

\* cited by examiner (a) core substrate (b) first interlayer insulation layer formation (c) via-hole perforation (d) via fill plating (e) first buildup layer pattern formation (e) second interlayer insulation layer formation (b) via-hole perforation (c) via fill plating (d) second buildup layer pattern formation

POLYIMIDE FILM

REFERENCE TO RELATED APPLICATION

This application is a national stage application under 35 USC 371 of International Application No. PCT/JP2004/019528, filed Dec. 27, 2004.

TECHNICAL FIELD

The present invention relates to a polyimide film, particularly, a polyimide film preferable as a substrate for high frequency-matching electrical parts and superior in heat resistance.

BACKGROUND ART

As a material for substrates for electrical parts of information and telecommunication devices (broadcast devices, mobile radio, portable telecommunication devices etc.), radar, highspeed information processing devices and the like, ceramic has been conventionally used. Substrates made of ceramic have heat resistance and can also be used for recent information telecommunication devices having a high frequency signal band (reaching the GHz band). However, ceramic is not flexible and cannot be made thin, which limits its applicable field.

Accordingly, consideration has been made as to the use of a film made of an organic material as a substrate for electrical parts, and a film made of polyimide and a film made of polytetrafluoroethylene have been proposed. The film made of polyimide has superior heat resistance and is strong, which enables advantageous provision of a thin film. On the other hand, problems of low signal strength, delay in signal transmission and the like are of concern in the application to high frequency signals. While the film made of polytetrafluoroethylene is also compatible with high frequency, it is associated with problems in that the film cannot be made thin due to low elastic modulus, the film shows poor adhesion to a metal conductor, a resistor and the like on the surface, the film is unsuitable for the production of ultrafine wiring circuits due to its high coefficient of linear thermal expansion which causes marked dimensional changes due to temperature change, and the like. As a result, its applicable field is limited. As the situation stands, a film for a substrate, which can simultaneously achieve heat resistance, applicability to high frequency and flexibility, has not been obtained.

In addition, as a polyimide film having a high elastic modulus, a polyimide benzoxazole film made of polyimide having a benzoxazole ring in the main chain has been proposed (see patent reference 1). A print wiring board with the polyimide benzoxazole film as a dielectric layer has also been proposed (see patent reference 2, patent reference 3).

patent reference 1 JP-A-6-56992
patent reference 2 JP-A-11-504369
patent reference 3 JP-A-11-505184

As compared to conventional polyimide films, the polyimide benzoxazole film is also superior in the heat resistance. Thus, the curling developed during heat processing tends to be suppressed. However, further improvements have been desired as electronics are miniaturized and the wiring becomes highly dense. In the application to ultrahigh frequency reaching the milliwave region, moreover, use of even a substrate made of a conventionally reported polyimide benzoxazole film is inferior to the use of a substrate made of ceramic. To be precise, since the properties of the film vary markedly in response to humidity, the efficiency of high frequency signal transmission is low, and the response speed is low (poor rise of pulse signals), speeding up of the operation of circuits made of a polyimide film is not easy, and further improvements are desired.

SUMMARY OF THE INVENTION

The present invention aims at providing a film made of an organic material with electronic property, particularly small humidity dependency, which maintains higher levels of heat resistance, applicability to high frequency and flexibility. In particular, the present invention aims at providing a polyimide film superior in thermal degradation stability, which is free of inconveniences due to curling even when various functional layers are laminated with heating.

The present inventors have conducted intensive studies and found that the dielectric loss tangent of a polyimide film can be unprecedentedly lowered by forming a particular higher order structure, and that such polyimide film simultaneously has heat resistance, applicability to high frequency and flexibility, which resulted in the completion of the present invention.

Accordingly, the present invention provides the following.
(1) A polyimide film obtainable by reacting an aromatic diamine with an aromatic tetracarboxylic acid anhydride, which has a planar orientation coefficient of 0.79-0.89 as measured by the X-ray diffraction method, and a dielectric constant of 2.7-3.1 at 100 GHz as measured by a cavity resonance perturbation method.
(2) The polyimide film of paragraph (1) just above, having a dielectric loss tangent at 100 GHz of 0.0001-0.03 as measured by the cavity resonance perturbation method.
(3) The polyimide film of paragraph (1) or (2) just above, having dielectric constants of 2.7-3.1 at 1 GHz and 2.6-3.0 at 100 GHz, as measured by the cavity resonance perturbation method.
(4) The polyimide film of any of paragraphs (1) to (3) just above, which has a density of 1.47 g/cm$^3$-1.55 g/cm$^3$.
(5) A polyimide film obtainable by reacting an aromatic diamine with an aromatic tetracarboxylic acid anhydride, wherein the amount of water vaporized at a high temperature during heating at 500° C. for 10 sec of the film immediately after helium purge at 170° C. for 7 min and preliminary drying is not more than 5000 ppm.
(6) The polyimide film of any of paragraphs (1) to (5) just above, wherein the ratio ($\epsilon_{65}/\epsilon_D$) of the dielectric constant $\epsilon_{65}$ at 100 GHz of the film humidity-conditioned under the constant temperature and humidity conditions of 20° C., 65% RH for 94 hr, as measured by a cavity resonance perturbation method, to the dielectric constant $\epsilon D$ at 100 GHz of the film vacuum dried under the conditions of 120° C. for 24 hr, as measured by a cavity resonance perturbation method, is within the range of 1.00-1.10.
(7) A polyimide film obtainable by reacting an aromatic diamine with an aromatic tetracarboxylic acid anhydride, wherein the absolute value of the difference between the surface planar orientation degree of one surface (surface A) and the surface planar orientation degree of the other surface (surface B) of the film is 0-2.
(8) The polyimide film of any of paragraphs (1) to (7) just above, wherein the surface planar orientation degree of a surface having a higher surface planar orientation degree is not more than 15.
(9) The polyimide film of any of paragraphs (1) to (8) just above, which has a curling degree of 0%-5%.

(10) The polyimide film of any of paragraphs (1) to (9) just above, wherein the aromatic diamine has a benzoxazole structure.

(11) A base substrate for printed wiring assemblies, which comprises the polyimide film of any of paragraphs (1) to (10) just above.

(12) A method of producing a polyimide film, which comprises reacting an aromatic diamine with an aromatic tetracarboxylic acid anhydride to give polyamide acid, casting a solution thereof on a support and drying the solution and the like to give a self-supporting polyimide precursor film (green film) and polyimidating said precursor film, wherein the polyimide precursor film (green film) satisfies all the relationships shown by the following formulas between an imidation rate Aim of one surface side (surface A side) and an imidation rate Bim of the other surface side (surface B side) of the polyimide precursor film (green film) and said polyimide precursor film is subjected to imidation.

formula 1: $|Aim-Bim| \leqq 5$ formula 2: $\leqq Aim \leqq 15$ formula 3: $\leqq Bim \leqq 15$.

The polyimide film of the present invention shows lower loss and faster response speed (good rise of pulse signals) at high frequency as compared to conventionally known polyimide films. Therefore, a circuit comprising the polyimide film of the present invention is expected to operate at a higher speed. In addition, it simultaneously has higher rigidity, strength and heat resistance than those of conventional polyimide films. Therefore, the film is preferably used for high frequency electronics and other electronics, and is useful as a substrate film for the production of copper-adhered substrates for flexible print circuit (FPC) with high size precision requirements, a carrier tape for tape automated bonding (TAB) and the like.

According to the present invention, for example, the difference in the surface planar orientation degree between the front and the back of the polyimide film is reduced by controlling the production conditions for obtaining a polyamide acid film from a polyamide acid solution and then imidating the polyamide acid film, whereby an unprecedented polyimide film superior in thermal degradation stability, which has a curling degree of not more than 5% can be obtained. Moreover, the film of the present invention shows the dielectric constant ratio between a dry film and a wet film within a certain range as compared to conventionally known polyimide films. Therefore, a circuit comprising the film of the present invention is expected to afford operation with low humidity dependency. In addition, since a polyimide film wherein the amount of water evaporated at a high temperature is extremely small can be obtained, the development of swelling and delamination can be prevented even when used as a substrate film for various electrical laminate parts at a high temperature.

BEST MODE FOR EMBODYING THE INVENTION

Figure 1:
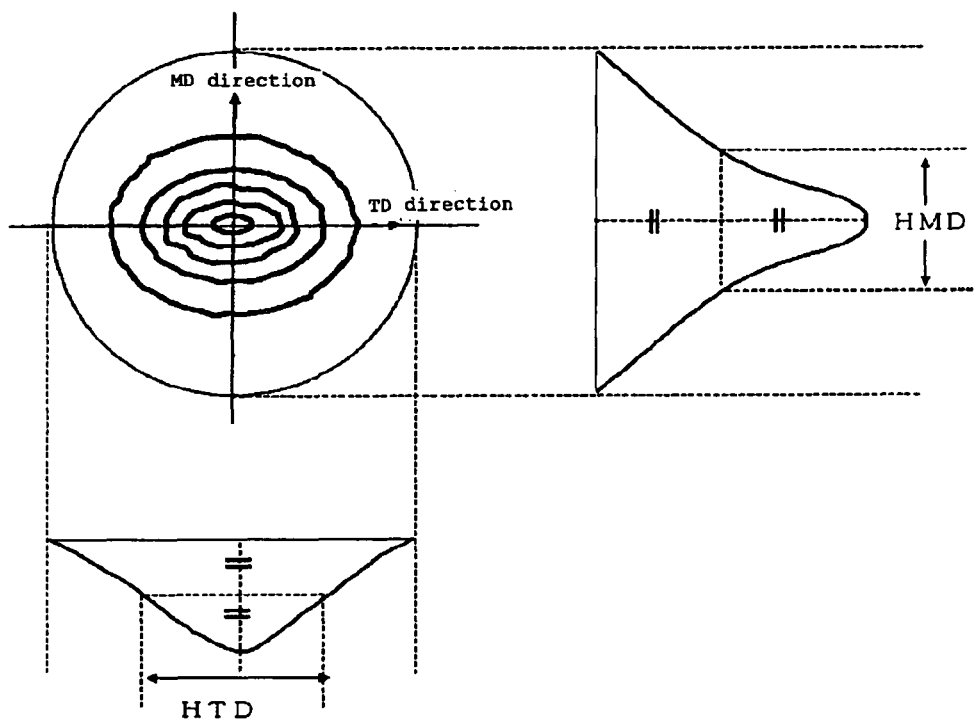
FIG. 1 schematically shows an X-ray diffraction pole figure of a polyimide film.
Figure 2:
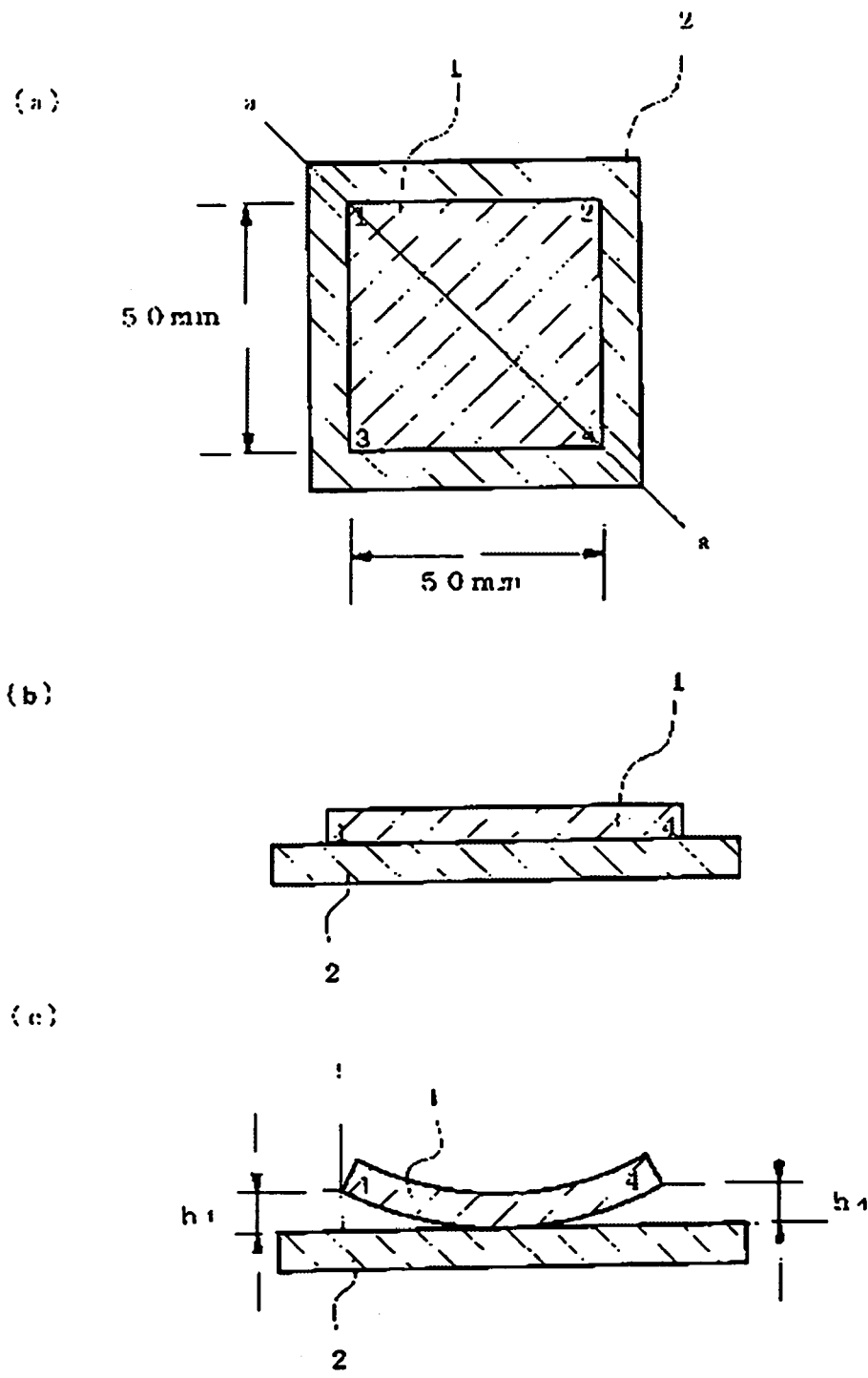
FIG. 2 is a schematic view showing the measurement method of the curling degree of a polyimide film, wherein (a) is a top view, (b) is a sectional view along a-a in (a) before a hot air treatment, and (c) is a sectional view along a-a in (a) after a hot air treatment.

The embodiment of the polyimide film of the present invention is explained in detail in the following.

The polyimide film of the present invention is made of polyimide obtainable by reacting aromatic diamines with aromatic tetracarboxylic acid anhydrides, and has a particular higher-order structure, particular dielectric property or a particular curling degree.

The aforementioned "reacting" includes first subjecting diamines and tetracarboxylic acid anhydrides to an open ring polyaddition reaction in a solvent to give a polyamide acid solution, then forming a green film and the like as necessary from the polyamide acid solution and subjecting the film to dehydrocondensation (imidation).

As the aromatic diamines, for example, 4,4'-bis(3-aminophenoxy)biphenyl, bis[4-(3-aminophenoxy)phenyl]ketone, bis[4-(3-aminophenoxy)phenyl]sulfide, bis[4-(3-aminophenoxy)phenyl]sulfone, 2,2-bis[4-(3-aminophenoxy)phenyl]propane, 2,2-bis[4-(3-aminophenoxy)phenyl]-1,1,1,3,3,3-hexafluoropropane, m-phenylenediamine, o-phenylenediamine, p-phenylenediamine, m-aminobenzylamine, p-aminobenzylamine, 3,3'-diaminodiphenylether, 3,4'-diaminodiphenylether, 4,4'-diaminodiphenylether, 3,3'-diaminodiphenylsulfide, 3,3'-diaminodiphenylsulfoxide, 3,4'-diaminodiphenylsulfoxide, 4,4'-diaminodiphenylsulfoxide, 3,3'-diaminodiphenylsulfone, 3,4'-diaminodiphenylsulfone, 4,4'-diaminodiphenylsulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(4-aminophenoxy)phenyl]methane, 1,1-bis[4-(4-aminophenoxy)phenyl]ethane, 1,2-bis[4-(4-aminophenoxy)phenyl]ethane, 1,1-bis[4-(4-aminophenoxy)phenyl]propane, 1,2-bis[4-(4-aminophenoxy)phenyl]propane, 1,3-bis[4-(4-aminophenoxy)phenyl]propane, 2,2-bis[4-(4-aminophenoxy)phenyl]propane, 1,1-bis[4-(4-aminophenoxy)phenyl]butane, 1,3-bis[4-(4-aminophenoxy)phenyl]butane, 1,4-bis[4-(4-aminophenoxy)phenyl]butane, 2,2-bis[4-(4-aminophenoxy)phenyl]butane, 2,3-bis[4-(4-aminophenoxy)phenyl]butane, 2-[4-(4-aminophenoxy)phenyl]-2-[4-(4-aminophenoxy)-3-methylphenyl]propane, 2,2-bis[4-(4-aminophenoxy)-3-methylphenyl]propane, 2-[4-(4-aminophenoxy)phenyl]-2-[4-(4-aminophenoxy)-3,5-dimethylphenyl]propane, 2,2-bis[4-(4-aminophenoxy)-3,5-dimethylphenyl]propane, 2,2-bis[4-(4-aminophenoxy)phenyl]-1,1,1,3,3,3-hexafluoropropane, 1,4-bis(3-aminophenoxy)benzene, 1,3-bis(3-aminophenoxy)benzene, 1,4-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfoxide, bis[4-(4-aminophenoxy)phenyl]sulfone, bis[4-(3-aminophenoxy)phenyl]ether, bis[4-(4-aminophenoxy)phenyl]ether, 1,3-bis[4-(4-aminophenoxy)benzoyl]benzene, 1,3-bis[4-(3-aminophenoxy)benzoyl]benzene, 1,4-bis[4-(3-aminophenoxy)benzoyl]benzene, 4,4'-bis(3-aminophenoxy)benzoyl]benzene, 1,1-bis[4-(3-aminophenoxy)phenyl]propane, 1,3-bis[4-(3-aminophenoxy)phenyl]propane, 3,4'-diaminodiphenylsulfide, 2,2-bis[3-(3-aminophenoxy)phenyl]-1,1,1,3,3,3-hexafluoropropane, bis[4-(3-aminophenoxy)phenyl]methane, 1,1-bis[4-(3-aminophenoxy)phenyl]ethane, 1,2-bis[4-(3- aminophenoxy)phenyl]ethane, bis[4-(3-aminophenoxy)phenyl]sulfoxide, 4,4'-bis[3-(4-aminophenoxy)benzoyl]diphenylether, 4,4'-bis[3-(3-aminophenoxy)benzoyl]diphenylether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)phenoxy-α,α-dimethylbenzyl]benzene, 1,3-bis[4-(4-aminophenoxy)phenoxy-α,α-dimethylbenzyl]benzene, 1,3-bis[4-(4-amino-6-trifluoromethylphenoxy)-α,α-dimethylbenzyl]benzene, 1,3-bis[4-(4-amino-6-fluorophenoxy)-α,α-dimethylbenzyl]benzene, 1,3-bis[4-(4-amino-6-methylphenoxy)-α,α-dimethylbenzyl]benzene, 1,3-bis[4-(4-amino-6-cyanophenoxy)-α,α-dimethylbenzyl]benzene, 3,3'-diamino-4,4'-diphenoxybenzophenone, 4,4'-diamino-5,5'-diphenoxybenzophenone, 3,4'-diamino-4,5'-diphenoxybenzophenone, 3,3'-diamino-4-phenoxybenzophenone, 4,4'-diamino-5-phenoxybenzophenone, 3,4'-diamino-4-phenoxybenzophenone, 3,4'-diamino-5'-phenoxybenzophenone, 3,3'-diamino-4,4'-dibiphenoxybenzophenone, 4,4'-diamino-5,5'-dibiphenoxybenzophenone, 3,4'-diamino-4,5'-dibiphenoxybenzophenone, 3,3'-diamino-4-biphenoxybenzophenone, 4,4'-diamino-5-biphenoxybenzophenone, 3,4'-diamino-4-biphenoxybenzophenone, 3,4'-diamino-5'-biphenoxybenzophenone, 1,3-bis(3-amino-4-phenoxybenzoyl)benzene, 1,4-bis(3-amino-4-phenoxybenzoyl)benzene, 1,3-bis(4-amino-5-phenoxybenzoyl)benzene, 1,4-bis(4-amino-5-phenoxybenzoyl)benzene, 1,3-bis(3-amino-4-biphenoxybenzoyl)benzene, 1,4-bis(3-amino-4-biphenoxybenzoyl)benzene, 1,3-bis(4-amino-5-biphenoxybenzoyl)benzene, 1,4-bis(4-amino-5-biphenoxybenzoyl)benzene, 2,6-bis[4-(4-amino-α,α-dimethylbenzyl)phenoxy]benzonitrile, aromatic diamines having a benzoxazole structure, and the above-mentioned aromatic diamines wherein the hydrogen atoms on the aromatic ring are partially or entirely substituted by a halogen atom, an alkyl group or alkoxy group having 1 to 3 carbon atoms, a cyano group, or a halogenated alkyl group or alkoxy group having 1 to 3 carbon atoms, wherein the hydrogen atoms of the alkyl group or alkoxy group are partially or entirely substituted by a halogen atom, and the like can be mentioned.

The aromatic diamines can be used alone or two or more kinds thereof can be used.

Particularly, since a polyimide film superior in heat resistance, strength and rigidity can be obtained, aromatic diamines having a benzoxazole structure are preferable. As the aromatic diamines having a benzoxazole structure, the following can be concretely mentioned.

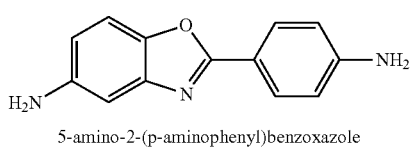

[formula 1]

5-amino-2-(p-aminophenyl)benzoxazole

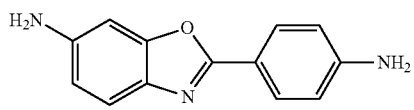

[formula 2]

6-amino-2-(p-aminophenyl)benzoxazole

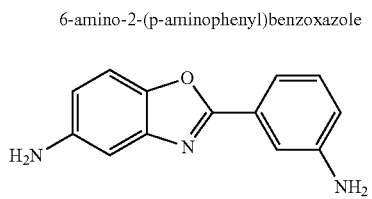

[formula 3]

5-amino-2-(m-aminophenyl)benzoxazole

[formula 4]

6-amino-2-(m-aminophenyl)benzoxazole

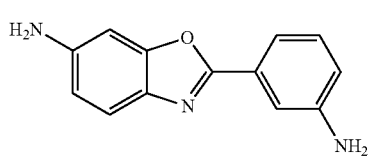

[formula 5]

2,2'-p-phenylenebis(5-aminobenzoxazole)

[formula 6]

2,2'-p-phenylenebis(6-aminobenzoxazole)

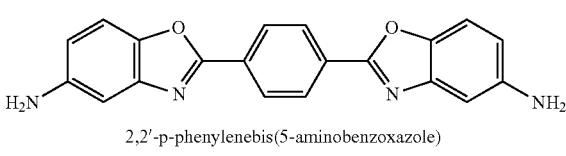

[formula 7]

1-(5-aminobenzoxazolo)-4-(6-aminobenzoxazolo)benzene

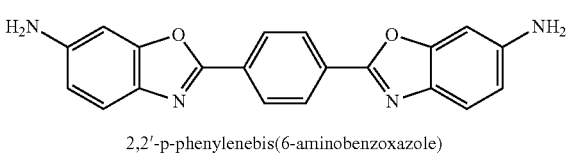

[formula 8]

2,6-(4,4'-diaminodiphenyl)benzo[1,2-d: 5,4-d']bisoxazole

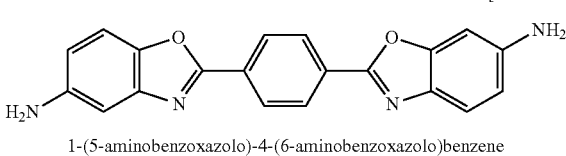

[formula 9]

2,6-(4,4'-diaminodiphenyl)benzo[1,2-d: 4,5-d']bisoxazole

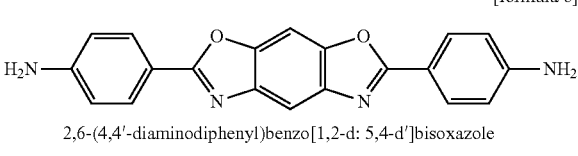

[formula 10]

2,6-(3,4'-diaminodiphenyl)benzo[1,2-d: 5,4-d']bisoxazole

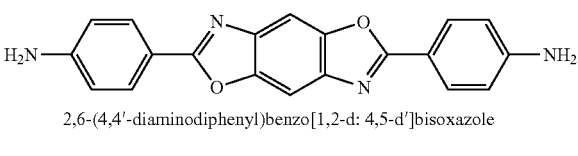

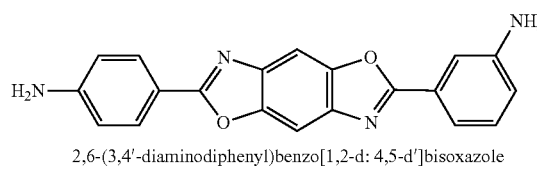

2,6-(3,4'-diaminodiphenyl)benzo[1,2-d: 4,5-d']bisoxazole

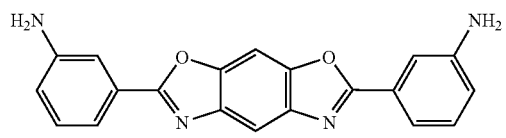

2,6-(3,3'-diaminodiphenyl)benzo[1,2-d: 5,4-d']bisoxazole

2,6-(3,3'-diaminodiphenyl)benzo[1,2-d: 4,5-d']bisoxazole

Of these, respective isomers of amino(aminophenyl)benzoxazole are preferable in view of easiness of synthesis. As used herein, the "respective isomers" are those determined by the positions of the two amino groups of amino(aminophenyl)benzoxazole (e.g., respective compounds of the above-mentioned "formula 1"-"formula 4").

The tetracarboxylic acid anhydrides to be used in the present invention are aromatic tetracarboxylic acid anhydrides. As the aromatic tetracarboxylic acid anhydrides, the following can be concretely mentioned.

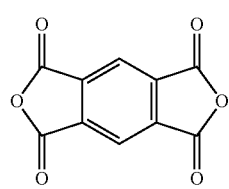

pyromellitic acid anhydride

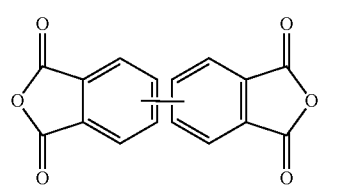

3,3',4,4'-biphenyltetracarboxylic acid anhydride

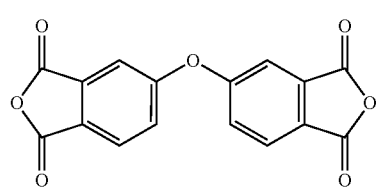

4,4'-oxydiphthalic acid anhydride

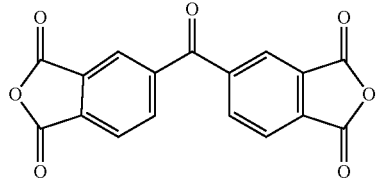

3,3',4,4'-benzophenonetetracarboxylic acid anhydride

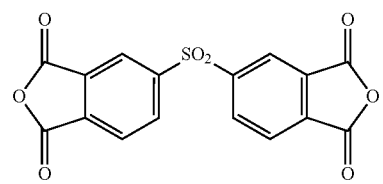

3,3',4,4'-diphenylsulfonetetracarboxylic acid anhydride

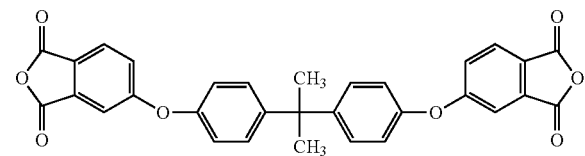

2,2-bis[4-(3,4-dicarboxyphenoxy)phenyl]propanoic acid anhydride

The aromatic tetracarboxylic acid anhydrides can be used alone or two or more kinds thereof can be used.

In the present invention, one or more kinds of the nonaromatic tetracarboxylic acid dianhydrides exemplified below may be concurrently used as long as their content is not more than 30 mol% of the total tetracarboxylic acid dianhydride. As the nonaromatic tetracarboxylic acid dianhydrides to be used, for example, butane-1,2,3,4-tetracarboxylic acid dianhydride, pentane-1,2,4,5-tetracarboxylic acid dianhydride, cyclobutanetetracarboxylic acid dianhydride, cyclopentane-1,2,3,4-tetracarboxylic acid dianhydride, cyclohexane-1,2,4,5-tetracarboxylic acid dianhydride, cyclohex-1-ene-2,3,5,6-tetracarboxylic acid dianhydride, 3-ethylcyclohex-1-ene-3-(1,2),5,6-tetracarboxylic acid dianhydride, 1-methyl-3-ethylcyclohexane-3-(1,2),5,6-tetracarboxylic acid dianhydride, 1-methyl-3-ethylcyclohex-1-ene-3-(1,2),5,6-tetracarboxylic acid dianhydride, 1-ethylcyclohexane-1-(1,2),3,4-tetracarboxylic acid dianhydride, 1- propylcyclohexane-1-(2,3),3,4-tetracarboxylic acid dianhydride, 1,3-dipropylcyclohexane-1- (2,3),3-(2,3)-tetracarboxylic acid dianhydride, dicyclohexyl-3,4,3',4'-tetracarboxylic acid dianhydride, bicyclo[2.2.1]heptane-2,3,5,6-tetracarboxylic acid dianhydride, 1- propylcyclohexane-1-(2,3),3,4-tetracarboxylic acid dianhydride, 1,3-dipropylcyclohexane-1- (2,3),3-(2,3)-tetracarboxylic acid dianhydride, dicyclohexyl-3,4,3',4'-tetracarboxylic acid dianhydride, bicyclo[2.2.1]heptane-2,3,5,6-tetracarboxylic acid dianhydride, bicyclo[2.2.2]octane-2,3,5,6-tetracarboxylic acid dianhydride, bicyclo[2.2.2]oct-7-ene-2,3,5,6-tetracarboxylic acid dianhydride and the like can be mentioned. The nonaromatic tetracarboxylic acid dianhydrides can be used alone or two or more kinds thereof can be used.

The polyimide film of the present invention can contain a so-called lubricant for forming ultrafine concaves and convexes on the film surface. As the lubricant, fine particles of an organic compound and/or an inorganic compound, which have an average particle size of about 0.01-5 μm can be used. The amount of the lubricant to be added is about 0.01-3% by mass of the mass of the film. In the present invention, highly heat resistant inorganic particles are preferably used, and metal oxide particles such as alumina, silica, titanium oxide and the like are more preferably used.

The polyimide film of the present invention is produced by (a) first condensing aromatic diamines and aromatic tetracarboxylic acid anhydrides in a solvent to give a polyamide acid solution (hereinafter to be referred to as Step (a)), then, (b) applying the polyamide acid solution to a support and drying the solution to afford self-supportiveness, which is specifically drying under the conditions to achieve the amount of the residual solvent relative to the total mass after drying of 25-50% by mass, to give a polyimide precursor film (also referred to as a green film) (hereinafter to be also referred to as step (b)), then, (c) heat treating the green film at a maximum temperature of 100-500° C. to allow imidation reaction (hereinafter to be referred to as step (c)).

In the above-mentioned steps (a)-(c), the film (including the green film) may be subjected to a stretching treatment where necessary, the area magnification ratio is preferably not more than 9, more preferably not more than 5, still more preferably not more than 2, and a non-stretch film free of a stretching treatment is further preferable. The non-stretch film here means a film obtained without drawing that intentionally applies a mechanical outer force such as tenter stretching, roll stretch, inflation stretch and the like. Too high an area magnification ratio is not preferable because the surface planar orientation degree of the polyimide film becomes too high, which makes it difficult to control the difference in the surface planar orientation degree between the front and the back of the film to fall within a given range, and the film is susceptible to the effect of change in the orientation due to a heat treatment (e.g., not less than 300° C.)

The production method of the polyimide film of the present invention (hereinafter to be simply referred to as the production method of the present invention) is explained in detail in the following.

Step (a)

The solvent used for polymerizing aromatic diamines and aromatic tetracarboxylic acid anhydrides to give polyamide acid is not particularly limited as long as it can dissolve any of the monomers to be the starting materials and the resulting polyamide acid. Preferred are polar organic solvents and, for example, N-methyl-2-pyrrolidone, N-acetyl-2- pyrrolidone, N,N-dimethylformamide, N,N-diethylformamide, N,N-dimethylacetamide, dimethyl sulfoxide, hexamethylphosphoric amide, ethyl cellosolveacetate, diethyleneglycoldimethyl- ether, sulforane, halogenated phenols and the like can be mentioned.

These solvents can be used alone or in a mixture. The amount of the solvent to be used is any as long as it is sufficient to dissolve monomers to be the starting materials. As a concrete amount to be used, an amount that affords generally 5-40% by mass, preferably 10-30% by mass, of the monomers in the solution dissolving the monomers can be mentioned.

The conditions for the polymerization reaction (hereinafter to be also simply referred to as "polymerization reaction") to obtain polyamide acid may be conventionally known ones, and a specific example includes continuous stirring and/or mixing in an organic solvent within a temperature range of 0-80° C. for 10 min-80 hr. Where necessary, the polymerization reaction may be divided, pressure may be applied or the temperature may be increased or decreased. In this case, while the order of addition of both monomers is not particularly limited, addition of aromatic tetracarboxylic acid anhydrides to a solution of aromatic diamines is preferable. The mass of polyamide acid in the polyamide acid solution obtained by the polymerization reaction is preferably 5-40% by mass, more preferably 10-30% by mass, and the viscosity of the aforementioned solution is preferably 10-2000 Pa·s, more preferably 100-1000Pa·s, as measured by a Brook Field viscometer (25° C.) in view of feeding stability.

Vacuum defoaming during the polymerization reaction is effective to produce a good-quality organic solvent solution of polyamide acid. In addition, polymerization may be controlled by adding a small amount of a terminal sequestering agent to aromatic diamines before the polymerization reaction. As the terminal sequestering agent, a compound having a carbon-carbon double bond such as maleic anhydride and the like can be mentioned. The amount of maleic anhydride to be used is preferably 0.001-1.0 mol per 1 mol of the aromatic diamines.

<Step (b)>

The support to be coated with a polyamide acid solution only needs to have smoothness and rigidity of the level sufficient to form a polyamide acid solution into a film-like product and, for example, a drum or belt-like rotation member having a surface made of a metal, plastic, glass, porcelain and the like, and the like can be mentioned. A method utilizing a polymer film having adequate rigidity and high smoothness is also a preferable embodiment. Particularly, the surface of the support is preferably a metal, more preferably stainless which is rustproof and superior in corrosion resistance. The surface of the support may be subjected to metal plating with Cr, Ni, Sn and the like. The surface of the support may be mirror-like or pearskin finished as necessary. A polyamide acid solution can be applied to a support by casting from a spinneret with a slit, extrusion from an extruder, squeeze coating, reverse coating, die coating, applicator coating, wire-bar coating and the like. Besides these, a conventionally known solution application means can be used appropriately.

As a support to replace the above-mentioned, metal plates (foil, film, plate) can be mentioned. To be specific, as one production method of the below-mentioned polyimide film to be used for the production of a base substrate for a printed wiring assembly, a metal plate to be a metal layer of the aforementioned base substrate is used as a support and coated with a polyamide acid solution. In this case, the application means of the polyamide acid solution is not particularly limited, and known application means such as comma coater, knife coater, roll coater, reverse coater, die coater, gravure coater, wire-bar and the like can be mentioned.

In Step (b), the amount of the residual solvent relative to the total mass (% by mass) of the obtained green film is preferably not more than 50% by mass, more preferably not more than 40% by mass, even more preferably not more than 35% by mass. When the amount of the residual solvent is greater than 50% by mass, the handling property becomes unpreferably degraded. While the lower limit of the amount of the residual solvent is not particularly limited, it is preferably not less than 25% by mass, more preferably not less than 30% by mass, to prevent film breakage during the imidation reaction step. The amount of the residual solvent can be measured (calculated) by TGA (thermogravimetric analysis), gel penetration chromatograph (GPC) and the like.

To obtain a green film (self-supporting film made from a polyamide acid solution) wherein the amount of the residual solvent relative to the total mass of the film is within a given range, as the drying conditions when, for example, N,N-dimethylacetamide or N-methylpyrrolidone is used as a solvent, the drying temperature is preferably 70-130° C., more preferably 75-125° C., further preferably 80-120° C. When the drying temperature is higher than 130° C., the molecular weight decreases and the green film tends to be brittle. In addition, during the green film production, the imidation partly proceeds and the desired physical properties cannot be obtained easily during the imidation step. When the temperature is lower than 70° C., the drying time tends to be long, the molecular weight easily decreases and the handling property may be degraded due to insufficient drying. While the drying time varies depending on the drying temperature, it is preferably 10-90 min, more preferably 15-80 min. When the drying time is longer than 90 min, the molecular weight decreases and the film tends to be brittle. When it is shorter than 10 min, the handling property may be degraded due to insufficient drying. Moreover, for the improvement of the drying efficiency or for the suppression of the development of bubbles during drying, the temperature may be stepwisely raised within the range of 70-130° C. to dry the film. As a dryer to achieve such conditions, a conventionally known dryer can be employed, and hot air, hot nitrogen, far infrared, high frequency induction heating and the like can be mentioned.

In the case of hot air drying, to achieve not more than a given level of a difference in the surface planar orientation degree between the front and the back of a green film during drying thereof to confer self-supportedness, the temperature difference between the upper face/lower face of the support is preferably controlled to not more than 10° C., preferably not more than 5° C. The temperature difference can be easily controlled by individually controlling the hot air temperatures of the upper face/lower face.

<Step (c)>

The green film obtained in Step (b) is imidated under given conditions to give a polyimide film.

As a concrete method of imidation, a conventionally known imidation reaction can be appropriately employed. For example, a method comprising, where necessary, conducting a stretch treatment using a polyamide acid solution free of a ring closing catalyst and a dehydrating agent, and then applying a heat treatment to allow progress of an imidation reaction (i.e., thermal ring closure method) and a chemical ring closure method comprising adding a ring closing catalyst and a dehydrating agent to a polyamide acid solution, and allowing an imidation reaction to be carried out by the action of the above-mentioned ring closing catalyst and the dehydrating agent can be mentioned.

The present inventors have obtained a new finding that particular imidation reaction conditions can adjust the planar orientation coefficient of the obtained film to a particular value, as well as a new finding that the film density can be controlled by subjecting the green film peeled off from the support to annealing before imidation treatment (mentioned below).

Exemplary heating maximum temperature in the thermal ring closure method is 100-500° C., preferably 200-480° C. When the heating maximum temperature is lower than the range, sufficient ring closure is difficult to achieve, and when it is higher than this range, deterioration proceeds and the film easily becomes brittle. As a more preferable embodiment, a two-step heat treatment comprising a treatment at 150-250° C. for 3-20 min, followed by a treatment at 350-500° C. for 3-20 min can be mentioned.

According to the chemical ring closure method, a polyamide acid solution is applied to a support, and an imidation reaction is partly progressed to form a self-supporting film, which is followed by heating to complete the imidation. In this case, the conditions to partly progress the imidation reaction is a heat treatment at preferably 100-200° C. for 3-20 min, and the conditions to complete the imidation reaction is a heat treatment at preferably 200-400° C. for 3-20 min.

The timing of addition of the ring closing catalyst to the polyamide acid solution is not particularly limited, and it may be previously added prior to the polymerization reaction to give polyamide acid. Specific examples of the ring closing catalyst include aliphatic tertiary amine such as trimethylamine, triethylamine and the like, heterocyclic tertiary amine such as isoquinoline, pyridine, β-picoline and the like. Of these, at least one kind of amine selected from heterocyclic tertiary amine is preferable. While the amount of the ring closing catalyst to be used is not particularly limited, it is preferably 0.5-8 mol per 1 mol of polyamide acid.

The timing of the addition of a dehydrating agent to a polyamide acid solution is not particularly limited, and it may be added in advance before a polymerization reaction to obtain polyamide acid. Specific examples of the dehydrating agent include aliphatic carboxylic acid anhydrides such as acetic anhydride, propionic acid anhydride, butyric acid anhydride and the like, aromatic carboxylic acid anhydrides such as benzoic acid anhydride and the like, and the like. Of these, acetic anhydride, benzoic acid anhydride and a mixture thereof are preferable. While the amount of the dehydrating agent to be used is not particularly limited, it is preferably 0.1-4 mol per 1 mol of polyamide acid. When a dehydrating agent is used, a gelation retardant such as acetylacetone and the like may be used in combination.

Whether a thermal ring closure reaction or a chemical ring closure method, a precursor (green sheet, film) of a polyimide film formed on a support may be peeled off from the support before complete imidation or after imidation.

The polyimide film of the present invention has a planar orientation coefficient of the film of 0.79-0.89, as measured by the X-ray diffraction method, and a dielectric constant at 100 GHz of the film of 2.7-3.1, as measured by a cavity resonance perturbation method. In addition, it is a polyimide film showing an amount of water evaporated at a high temperature of not more than 5000 ppm. Moreover, the absolute value of the difference between the surface planar orientation degree of one surface (surface A) of the film and that of the other surface (surface B) is 0-2.

<Planar Orientation Coefficient of Film>

The film of the present invention has a planar orientation coefficient of 0.79-0.89, as measured by the X-ray diffraction method. When the planar orientation coefficient of the film is less than 0.79, the dielectric loss tangent of the film becomes high, which renders it unsuitable for use at a high frequency.

The planar orientation coefficient is a parameter for expressing the higher-order structure of the molecule constituting the film. It numerically expresses the level of orientation, to the film surface, of a particular lattice surface of the crystal lattice, which is a constituent unit of a crystal part having a high orderliness of the molecules constituting the film. A higher value thereof means a smaller difference between the orientation of the aforementioned particular lattice surface and the orientation of the film surface. In the polyimide film of the present invention, "a particular lattice surface" means a lattice surface showing a diffraction peak near $2\theta=21.8°$. The concrete measurement operation of the planar orientation coefficient of the film is described in Examples.

In general, as a means for controlling the planar orientation coefficient of the film, adjustment of temperature rise profile during green film forming, stretching during imidation and the like can be mentioned, and the above-mentioned means are applicable to the film of the present invention. For example, to make the planar orientation coefficient of the polyimide film higher, a means of reducing the amount of heat to be applied to the green film, and a means of stretching the film in the longitudinal direction, the transverse direction, or both the longitudinal and transverse directions during an imidation reaction can be mentioned. Conversely, to lower the planar orientation coefficient of the polyimide film, a means of increasing the amount of heat to be applied to the green film can be mentioned. Depending on the heating conditions during imidation of the polyimide precursor (polyamide acid), the present inventors can control the planar orientation coefficient of the obtained film. As a preferable means to control the planar orientation coefficient of the film, the heating conditions during imidation can be mentioned. For example, the following heating conditions for imidation reaction are preferable:

method of imidation: two-step heat treatment by thermal ring closure method, first step heat treatment: treatment at 150-250° C. for 1-10 min, second step heat treatment: treatment at 400-600° C. for 0.1-15 min, temperature rise conditions from the completion of the first step heat treatment to the start of the second step heat treatment: 2-7° C./sec.

<Film Density>

The film of the present invention preferably has a density of 1.47-1.55 g/cm$^3$, as measured by the density gradient column method. When the film density is less than 1.47, the dielectric constant of the film becomes high, which is unsuitable for use at a high frequency. A concrete measurement operation of the film density is described in the Examples.

As a means to control the film density, the residual amount of the solvent in the green film may be increased, stretching may be applied during imidation, and the like, and the above-mentioned means are applicable to the film of the present invention. For example, to increase the density of the polyimide film, a means of reducing the amount of heat to be applied to the green film, and a means of stretching the film in the longitudinal direction, the transverse direction, or both the longitudinal and transverse directions during an imidation reaction can be mentioned. Conversely, to lower the density of the polyimide film, a means of increasing the amount of heat to be applied to the green film can be mentioned. Moreover, the present inventors have obtained a new finding that annealing of a polyimide precursor (polyamide acid) before the imidation treatment enables control of the density of the obtained film. As a preferable means to control the film density, annealing before an imidation treatment can be mentioned. For example, the following conditions for annealing before imidation reaction treatment are preferable:

method of annealing before imidation: one-step annealing treatment, annealing treatment: treatment at 120-150° C. for 1-10 min, temperature rise conditions: 0.5-3° C./sec.

<Dielectric Property of Film>

The film of the present invention as mentioned above shows a small dielectric constant at high frequency and is suitable for use at high frequency. The dielectric constant of the film is defined relative to the signals entering the film surface direction. From the aspect of applicability at high frequency, a smaller dielectric constant of the film is preferable. A smaller lower limit of the dielectric constant is preferable from the aspect of high frequency characteristics. However, when a dielectric constant of the polyimide film is not more than a given range, other physical properties, particularly mechanical property, are strikingly degraded, which is practically unpreferable. The film of the present invention dielectric constant is 2.60-3.00 at 100 GHz, as measured by a cavity resonance perturbation method. It is preferably 2.65-2.90, more preferably 2.70-2.80. The dielectric constant of the film of the present invention at 1 GHz is preferably 2.70-3.10, as measured by a cavity resonance perturbation method. It is preferably 2.75-3.00, more preferably 2.80-2.90.

The dielectric loss tangent of the film of the present invention at 100 GHz is preferably small, not more than 0.01 is preferable, not more than 0.003 is more preferable, and not more than 0.001 is further preferable. While the lower limit of the dielectric loss tangent is not particularly determined, from the aspect of film production, for example, 0.0001 can be mentioned. In the present invention, the dielectric constant and dielectric loss tangent of the film are measured by a cavity resonance perturbation method. Concrete measurement operation is described in the Examples.

The present inventors have newly found that the dielectric property of the film can be controlled by controlling the density and planar orientation coefficient of the polyimide film. As other means capable of controlling the dielectric of the film, a method of controlling the ratio of a compound remaining as polyamide acid in the film without imidation (hereinafter to be also referred to as "ratio of unreacted polyamide acid") can be mentioned. For example, to increase the dielectric constant of the polyimide film, a means of increasing the ratio of unreacted polyamide acid can be mentioned. Conversely, to lower the dielectric constant of the polyimide film, a means of reducing the ratio of unreacted polyamide acid can be mentioned. As a means to control a dielectric loss tangent of the film, a means of controlling the ratio of a compound remaining as polyamide acid in the film without imidation (hereinafter to be also referred to as "ratio of unreacted polyamide acid") or controlling the film density can be mentioned. For example, to lower the dielectric loss tangent of the polyimide film, a means of decreasing the ratio of unreacted polyamide acid or increasing the film density can be mentioned.

<Humidity Dependency of Dielectric Constant>

The polyimide film of the present invention preferably shows a ratio $\epsilon_{65}/\epsilon_D$ within the range of 1.00-1.10, of the dielectric constant $\epsilon_{65}$ at 100 GHz of the humidity-conditioned film under the constant temperature and humidity conditions of 20° C., 65% RH for 94 hr, as measured by a cavity resonance perturbation method, to the dielectric constant $\epsilon_D$ at 100 GHz of the film vacuum dried under the conditions of 120° C., 24 hr, as measured by a cavity resonance perturbation method. With this range, a substrate for an electronic circuit substrate with low humidity dependency and high reliability can be obtained. As a means to achieve this range, for example, a method of reducing the amount of water evaporated from the film at a high temperature can be mentioned (mentioned later).

<Amount of Water Evaporated at High Temperature>

Being maintained under an inert gas atmosphere at 170° C. for 7 min for preliminary drying and then heated at 500° C. for 10 sec, the polyimide film of the present invention preferably shows the amount (ppm) of water evaporated during heating at 500° C. for 10 sec as mentioned above relative to the polyimide film before preliminary drying (in the present specification, hereinafter sometimes to be abbreviated as "the amount of water evaporated at a high temperature") of not more than 10000 ppm. It is more preferably not more than 7000 ppm, more preferably not more than 4000 ppm, and particularly preferably not more than 2500 ppm.

When the amount of water evaporated at a high temperature is greater than 10000 ppm, the swelling of the polyimide film due to the development of void and the like becomes too high, which easily develops a contact failure caused by delamination.

While a smaller "amount of water evaporated at a high temperature" is more preferable, in consideration of easiness of production, cost and the like, it only needs to be at a level free of substantial inconvenience and the concrete lower limit thereof is not less than 10 ppm. A concrete measurement operation of "the amount of water evaporated at a high temperature" is described in the Examples.

To obtain a polyimide film with a small amount of water evaporated at a high temperature, in both the thermal ring closure method and the chemical ring closure method, a heat treatment with a temperature profile by dwelling in a temperature range of not less than 400° C. for not less than 5 min is necessary, and the temperature profile is preferably by dwelling in a temperature range of 400° C.-430° C. for not less than 20 min, more preferably dwelling in a temperature range of 430-460° C. for not less than 10 min, further preferably dwelling in a temperature range of 460-500° C. for not less than 5 min. By a heat treatment of a green film with such temperature profile, the imidation reaction can be carried out to achieve an amount of water evaporated at a high temperature of not more than a given range. While the upper limits of the temperature and time of the temperature profile are not particularly restricted, to avoid decomposition of the film, the temperature is not more than 600° C., preferably not more than 550° C. and, in consideration of the producibility, the time is not more than 60 min, preferably not more than 40 min, further preferably not more than 30 min.

<Curling degree>

The polyimide film of the present invention is an about flat film made of polyimide obtained by polycondensation of aromatic diamines and aromatic tetracarboxylic acid anhydrides, and preferably has a curling degree of not more than 5%. It is possible to have unprecedented superior thermal degradation stability. A concrete measurement operation of the curling degree of a film is described in the Examples.

<Difference in the Surface Planar Orientation Degree Between One Surface and the Other Surface>

In the polyimide film of the present invention, the difference in the surface planar orientation degree between one surface and the other surface is preferably 0-2, more preferably 0-1.5, further preferably 0-1.

When the difference in the surface planar orientation degree between the front and the back of the polyimide film is too large, the difference in the stress present in the film between the front and the back becomes large, which is considered to develop curling upon heating treatment and the like. In the present invention, by controlling the difference in the surface planar orientation degree to not more than 2, the thermal degradation stability suitable for a carrier tape for FPC, TAB and the like, as evidenced by the curling degree of the polyimide film of not more than 5%, can be achieved. A concrete measurement operation of the difference in the surface planar orientation degree between one surface and the other surface is described in the Examples. The difference in the surface planar orientation degree between one surface and the other surface is represented by the absolute value of difference, which is obtained by the measurement of the surface planar orientation degree for the front and the back of the polyimide film of the present invention.

In the polyimide film of the present invention, the surface planar orientation degree of the surface having a higher surface planar orientation degree is preferably not more than 15, more preferably not more than 10. In the polyimide film of the present invention, when the surface planar orientation degree of the surface having a higher surface planar orientation degree is higher than 15, the difference in the surface planar orientation degree between the front and the back of the film cannot be easily adjusted to a given range, and the film is susceptible to thermal degradation due to a heat treatment (e.g., not less than 300° C.).

In the polyimide film of the present invention, while the lower limit of the surface planar orientation degree of the surface having a higher surface planar orientation degree is not particularly limited, from the aspect of the planarity of the film, it is preferably not less than 1, more preferably not less than 3 and further preferably not less than 7.5.

In step (b), since the direction of evaporation of the solvent during drying of the green film to achieve self-supportedness is limited to the surface in contact with the air, the surface planar orientation degree of the surface of the green film in contact with the air (hereinafter to be also referred to as surface A) tends to be higher than the surface planar orientation degree of the surface in contact with the support (hereinafter to be also referred to as surface B). To obtain a polyimide film showing the difference in the surface planar orientation degree between the front and the back of the film of not more than 2, it is important to obtain a green film showing a small difference in the surface planar orientation degree between the front and the back. For this end, for example, a support is coated with a polyamide acid solution, and the conditions for drying to give a self-supporting green film is controlled, whereby a green film showing a small difference in the surface planar orientation degree between the front and the back can be obtained.

Such difference in the surface planar orientation degree between the front surface and the back surface of the green film is preferably not more than 1.7, more preferably not more than 1.5, further preferably not more than 1. When the difference in the surface planar orientation degree between the front surface and the back surface of the green film exceeds 1.7, the difference in the surface planar orientation degree between the front surface and the back surface of the polyimide film may not be controlled to not more than 2.

By controlling the amount of the residual solvent relative to the total mass after drying, during drying a green film to achieve self-supportedness, a green film showing the difference in the surface planar orientation degree between the front surface and the back surface within a given range can be obtained. To be specific, the amount of the residual solvent relative to the total mass after drying is preferably 25-50% by mass, more preferably 35-50% by mass. When the amount of the residual solvent is lower than 25% by mass, the surface planar orientation degree of surface A of the green film becomes relatively high, which makes it difficult to obtain a green film showing a small difference in the surface planar orientation degree between the front surface and the back surface. In addition, due to the decreased molecular weight, the green film tends to be brittle. When it exceeds 50% by mass, the self-supportedness becomes insufficient, and the transport of the film may become difficult. The amount of the residual solvent can be measured (calculated) by TGA (thermogravimetric analysis) and the like.

While the thickness of the polyimide film is not particularly limited, in consideration of use as a base substrate for the below-mentioned printed wiring assembly, it is generally 1-150 μm, preferably 3-50 μm. The thickness can be easily controlled by the amount of a polyamide acid solution to be applied to a support, and the concentration of the polyamide acid solution.

The polyimide film obtained by the above-mentioned production method is wound with the surface having a higher surface planar orientation degree facing inside to give a tubular product, whereby a polyimide film having a smaller curling degree can be obtained.

When the film is wound with the surface having a higher surface planar orientation degree facing inside to give a tubular product, its radius of curvature is preferably within the range of from 30 mm to 300 mm. When the radius of curvature exceeds this range, the curling degree of the polyimide film may become greater.

Now, a base substrate for a printed wiring assembly comprising the aforementioned polyimide film is explained.

As used herein the "base substrate for a printed wiring assembly" is an about planar substrate comprising an insulating plate and a metal layer laminated on at least one surface of the plate. The metal layer to be laminated may be one for a circuit intended to form a circuit by a processing such as etching and the like. Alternatively, it may be a metal layer used for releasing heat and the like without a particular post-processing, together with an insulating plate.

As the use of "a base substrate for a printed wiring assembly", FPC, a carrier tape for TAB, a substrate for COF, a substrate for CSP and the like are preferable, since the characteristic of small curling degree of the polyimide film of the present invention can be utilized.

The metal to be laminated on at least one surface of the polyimide film is not particularly limited, and is preferably copper, aluminum, stainless steel and the like. The laminating means is not particularly limited and the following means can be exemplified:

means of adhering a metal plate to a polyimide film with an adhesive, means of forming a metal layer on a polyimide film by a vacuum coating technique such as vapor deposition, sputtering, ion plating and the like, means of forming a metal layer on a polyimide film by wet plating method such as electroless plating, electroplating and the like.

These means can be used alone or in combination to laminate a metal layer on at least one surface of a polyimide film.

Of these, as a method for laminating a metal layer, a method comprising forming an underlaying metal layer by sputtering and thickening by electroplating is a particularly preferable embodiment.

In this case, as the underlaying metal, a single metal or alloy of Cu, Ni, Cr, Mo, Zn, Ti, Ag, Au, Fe and the like can be used. In addition, a good conductor such as Cu and the like may be attached as a conductive layer to an underlying metal by sputtering.

The thickness of the underlayer and conductive layer is preferably 100-5000 Å.

As a metal to be electroplated, Cu is preferable.

While the thickness of the metal layer is not particularly limited, when the metal layer is used for a circuit (conductive), the thickness of the metal layer is preferably 1-175 μm, more preferably 3-105 μm. When a polyimide film adhered with a metal layer is used as a heat release substrate, the thickness of the metal layer is preferably 50-3000 μm. While the roughness of the surface to be adhered to polyimide of the metal layer is not particularly limited, metal layers showing Ra of not more than 0.1 μm and Rz of not more than 1.00 μm are preferable, according to JIS B 0601 (Definition and Designation of Surface Roughness) based on the center line average roughness (hereinafter indicated as Ra) and 10 points average roughness (hereinafter indicated as Rz), since the metal layers afford a greater improving effect on the adhesion to the metal layer. Of such metal layers, one simultaneously satisfying the conditions is particularly preferable. While smaller Ra and Rz are more preferable, the lower limit of Ra is 0.0001 μm and, for example, the lower limit of Rz is 0.001 μm, due to the easiness of obtaining and processing.

The metal layer to be used in the present invention may have, on its surface, a coating film of inorganic materials of a single metal, metal oxide and the like. In addition, the surface of the metal layer may be subjected to a treatment with a coupling agent (aminosilane, epoxysilane and the like), a sandblast treatment, a honing treatment, a corona treatment, a plasma treatment, an etching treatment and the like. Similarly, the surface of the polyimide film may be subjected to a honing treatment, a corona treatment, a plasma treatment, an etching treatment and the like.

EXAMPLES

The effectiveness of the present invention is explained in the following by referring to Examples, which are not to be construed as limitative. In the following Examples, the evaluation methods of the properties are as follows.

1. Reduced viscosity (ηsp/C) of polyamide acid

A solution of a polymer in N-methyl-2-pyrrolidone to a polymer concentration of 0.2 g/dl was measured with a Ubbelohde type viscosity tube at 30° C.

2. Film thickness of polyimide film

The film thickness was measured with a micrometer (Millitron (R)1245D, manufactured by Finepruf).

3. Tensile elastic modulus, tensile strength at break and tensile elongation at break of polyimide film A film after drying was cut out in the longitudinal direction (MD direction) and transverse direction (TD direction) to give a reed-shaped strip (length 100mm, width 10 mm) as a test piece, which was subjected to the measurement of tensile elastic modulus, tensile strength at break and tensile elongation at break using a tensile test machine (AUTOGRAPH (R), model AG-5000A, manufactured by Shimadzu Corporation) at a tensile rate of 50mm/min and a chuck distance of 40 mm.

4. Coefficient of Linear Thermal Expansion of Polyimide Film (CTE)

The rate of expansion and contraction was measured under the following conditions, wherein 30-300° C. was divided by 15° C. and CTE was determined from the average of rate of expansion and contraction of each divided range/temperature.

name of apparatus: TMA4000S manufactured by MAC SCIENCE
sample length: 20 mm
sample width: 2 mm
temperature rise start at: 25° C.
temperature rise end at: 400° C.
rate of temperature rise: 5° C./min
atmosphere: argon 5. Melting Point and Glass Transition Temperature of Polyimide Film The sample was subjected to DSC measurement under the following conditions and the melting point (melting peak temperature Tpm) and the glass transition temperature (Tmg) were determined under the following measurement conditions according to JIS K 7121.

name of apparatus: DSC3100S manufactured by MAC SCIENCE
pan: aluminum pan (non-airtight type)
sample mass: 4 mg
temperature rise start at: 30° C.
rate of temperature rise: 20° C./min
atmosphere: argon 6. Thermal Decomposition Temperature of Polyimide Film The thermal decomposition temperature was defined by subjecting a fully dried sample to TGA measurement (thermobalance measurement) under the following conditions, and measuring 5% mass reduction.

name of apparatus: TG-DTA2000S manufactured by MAC SCIENCE
pan: aluminum pan (non-airtight type)
sample mass: 10 mg
temperature rise start at: 30° C.
rate of temperature rise: 20° C./min
atmosphere: argon 7. Planar Orientation Coefficient of the Polyimide Film A measurement target polyimide film was set on a measurement jig, X-ray diffraction measurement was performed under the following conditions, and a pole figure of the diffraction peaks appearing near 2θ=21.8° was drawn.

name of apparatus: RINT 2100PC manufactured by Rigaku Corporation, multipurpose sample table
voltage, electric current: 40 kV, 40 mA
measurement methods: reflection method and through method
scanning range: reflection method
α; 15-90°/2.5° intervals
β; 0-360°/5° intervals
reflection method
α; 0-15°/2.5° intervals
β; 0-360°/5° intervals
slit: DS 0.1 mm, SS 7 mm, RS 7 mm,
longitudinal divergence limiting slit 1.2 mm
scanning speed: continuous (360°/min)
detector: scintillation counter FIG. 1 schematically shows the pole figure. In the Figure, peak half-width (HMD and HTD) was determined from the diffraction strength profile at two broken lines, and an average value of HMD and HTD was defined as Ha (unit:°). The peak half-width was determined using the analysis programs manufactured by Rigaku. The planar orientation coefficient of the polyimide film was calculated from the thus-obtained Ha by the following formula:

planar orientation coefficient=(180°−Ha)÷180°

8. Difference in the Surface Planar Orientation Degree of Polyimide Film

The surface planar orientation degree was measured using polarized ATR and at incident angle 45°, decomposability 4 $cm^{-1}$ and number of integration 128 times. The absorption coefficient (Kx) in the MD direction, absorption coefficient (Ky) in the TD direction and absorption coefficient (Kz) in the thickness direction at the peak (aromatic ring oscillation) near 1480 $cm^{-1}$ were determined for each of the front and the back of the polyimide film, and the surface planar orientation degree was calculated from the following formula:

surface planar orientation degree=(Kx+Ky)/2×Kz

In addition, the difference in the surface planar orientation degree between the front and the back of the polyimide film of the present invention is, as shown in the following formula, calculated from the absolute value of the difference in the surface planar orientation degree between the surface on the air side (surface A) and the surface on the support side (surface B):

difference in the surface planar orientation degree=|surface planar orientation degree of surface A−surface planar orientation degree of surface B| name of apparatus: FT-IR (FTS-60A/896 manufactured by Digilab)
one time reflection ATR attachment: golden gate MKII (manufactured by SPECAC)
IRE: diamond
incident angle: 45°

9. Curling Degree of Polyimide Film

A 50 mm×50 mm test piece was set on an alumina-ceramic flat board, hot air treated at 400° C. for 10 min and then a curling degree was calculated from the following formula wherein an average value of the distance ($h_1$, $h_2$, $h_3$, $h_4$: unit mm) from the ceramic boards on four corners was taken as a curl amount (mm). The curl amount of the ceramic board itself used is not more than 0.1 mm.

curl amount (mm)=($h_1$+$h_2$+$h_3$+$h_4$)/4 curling degree (%)=100×(curl amount, mm)/35.36 mm

10. Volume Resistivity of Polyimide Film

Using the method according to JIS C2318, the volume resistivity was measured.

11. Dielectric Breakdown Voltage of Polyimide Film

Using the method according to JIS C2318, the dielectric breakdown voltage was measured.

12. Dielectric Constant of Polyimide Film (Preparation of Test Piece)

The polyimide films in the number necessary to afford a desired thickness were placed on top of one another, pressed with a load of 300 kgf/$cm^2$ to give a 1.6 mm×1.5 mm×75 mm rectangular columnar test piece.

(Measurement of Test Piece)

Using a N5250A milliwave PNA Series Network Analyzer manufactured by Agilent Technologies, the dielectric constant and dielectric loss tangent within the range of 1 GHz-100 GHz were measured and recorded for the above-mentioned sample according to the cavity resonance perturbation method.

Using the rectangular columnar test piece, a dry sample and a humidity-conditioned sample were prepared as follows. The dry sample was obtained by vacuum drying a rectangular columnar test piece at 120° C. for 24 hr. In addition, the humidity-conditioned sample was obtained by humidity-conditioning a rectangular columnar test piece under constant temperature and humidity conditions at 20° C., 65% RH for 94 hr. The dielectric property measurement was performed immediately after completion of drying or humidity-conditioning, or the dry or humidity-conditioned film state was maintained by preserving in an aluminum sack under a nitrogen atmosphere until the dielectric property measurement.

(Measurement of Test Piece)

Using a N5250A milliwave PNA Series Network Analyzer manufactured by Agilent Technologies, the dielectric constant and dielectric loss tangent within the range of 1 GHz-100 GHz were measured and recorded for the above-mentioned humidity-conditioned sample according to the cavity resonance perturbation method. In Examples 5, 6 and Comparative Examples 4, 5, the dielectric constant and dielectric loss tangent at 100 Hz were also measured and recorded for a dry sample.

13. Density of Polyimide Film

A polyimide film was cut out into a 5 mm×5 mm size and subjected to a density measurement. The sample thus cut out was cast into a density gradient tube prepared with a aqueous calcium nitrate solution, and the density was measured from the position of a standard float previously set therein, whose density had been known, an analytical density curve and the position of the sample after 5 hr. The liquid temperature of the density gradient tube was 30° C.

14. Measurement Method of the Amount of Residual Solvent in Polyimide Precursor Film Using a TGA apparatus (TG-DTA2000S manufactured by MAC SCIENCE), heat mass decrease of a polyimide precursor film subjected to temperature rise from room temperature to 400° C. at 10° C./min in a nitrogen stream and maintained at 400° C. for 30 min was measured. The mass decrease rate was taken as the amount of the residual solvent (% by mass) assuming that all the mass decrease was caused by evaporation of the residual solvent.

15. Content of Water Evaporated from Polyimide Film at High Temperature

Using a Curie-point type thermal decomposition device and according to the GCMS method, the amount of evaporated water was determined.

A sample (roughly 8 mg) was precisely measured (basis weight A (mg)) in a pyrofoil for 500° C. (manufactured by Japan Analytical Industry Co., Ltd.) dried in advance by heat treatment. An incubation temperature in the thermal decomposition device was set to 170° C., the sample foil was introduced thereinto, purged with helium for 7 min and water adsorbed to the film was removed by preliminary drying. Then, the film was immediately heated by oscillation operation at 500° C. for 10 sec. As regards the water evaporated from the film during heating at 500° C. for 10 sec, water ion peak at m/z=18 was detected by GCMS. The peak area was measured and developed water content B (μg) was determined by the absolute analytical curve method. The analytical curve was formed from the peak area of a standard solution containing not less than two levels of a given amount of water, which was prepared using, as a preparation reagent, dry methanol over anhydrous sodium sulfate, at m/z=18 by GCMS. The analytical curve was y=ax+b (a: slope, b: intercept, y: developed water content B (μg), x: peak area). The amount of water evaporated from the polyimide film at a high temperature was calculated from the following formula.

the amount of water evaporated at a high temperature (ppm)=B (μg)/(A (mg)×1000)

thermal decomposition GCMS conditions apparatus: HP5971A (GCMS manufactured by HP), JHS-3 (thermal decomposition device manufactured by Japan Analytical Industry Co., Ltd.)

column: PORAPLOT-Q (manufactured by GL Sciences Inc.), ϕ0.32 mm×10 m column temperature: 60° C. constant flow rate: He 0.7 ml/min, split injection 16. Solder Heat Resistance and Contact Failure Rate of Polyimide Film <Preparation of Adhesive>

As an adhesive, (A) polyamide resin (acid component: dimer acid, amine component: hexamethylenediamine, acid value 1.0, amine value 0), (B) epoxy resin I: 4,4'-bis(2,3-epoxypropoxy)-3,3',5,5'-tetramethylbiphenyl (epoxy equivalent amount: 190) (C) epoxy resin II. bisphenol A type epoxy resin (epoxy equivalent amount: 186), (D) phenol resin resolphenol "CKM-1282" (manufactured by SHOWA HIGH-POLYMER CO., LTD.), and (E) additive 2-heptadecylimidazole were mixed at a ratio of 50.0:8.0:12.0:29.5:0.5 (mass ratio) and used.

<Production of Buildup Multi-Layer Wiring Board>

Figure 3:
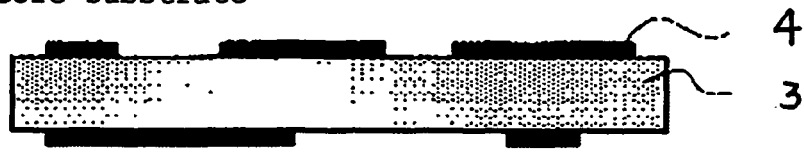
FIG. 3 is a schematic view showing a step for forming a first buildup layer in the production of a buildup multi-layer wiring board.
Figure 3:
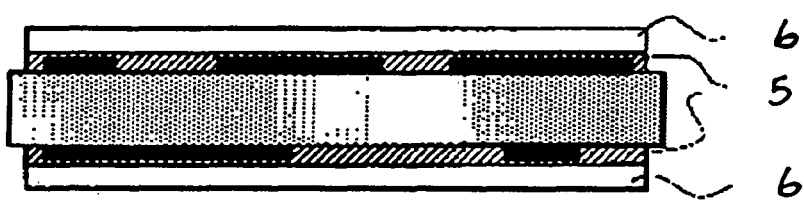
Figure 3:
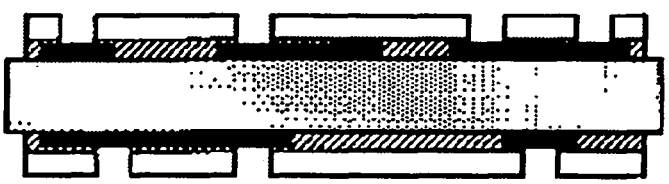
Figure 3:
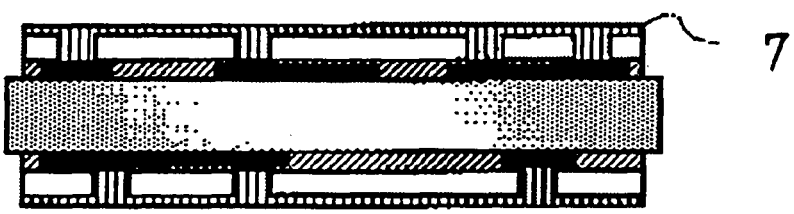
Figure 3:
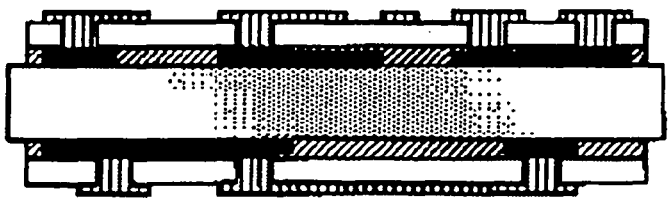
Figure 4:
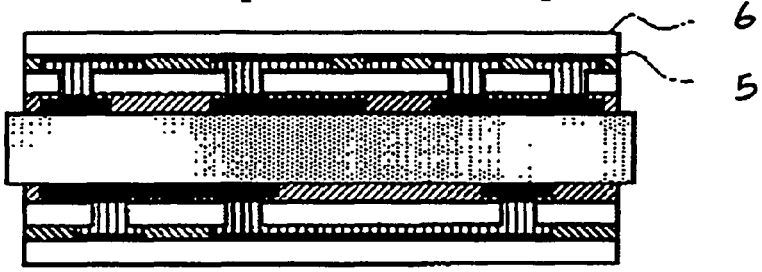
FIG. 4 is a schematic view showing a step for forming a second buildup layer in the production of a buildup multi-layer wiring board.
Figure 4:
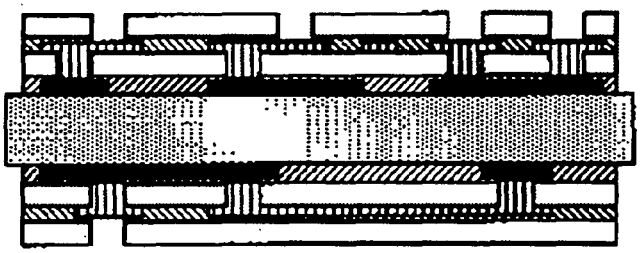
Figure 4:
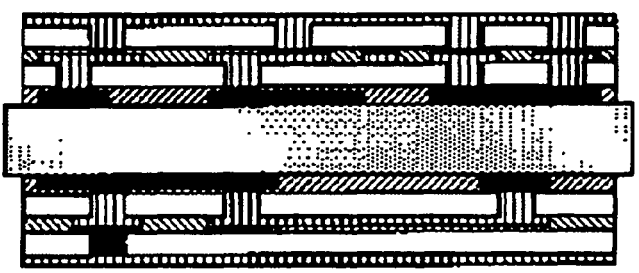
Figure 4:
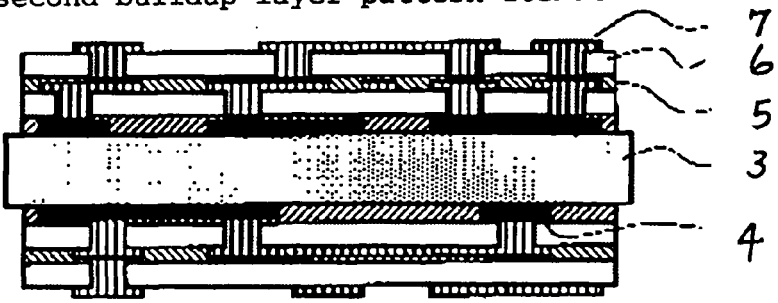

A 4 layer print wire board of FR4 was used as a core layer, and the buildup multi-layer printed wire boards shown in FIGS. 3, 4 were preproduced. The thickness of the copper foil on the surface of the core layer was 25 μm. An adhesive solution was first applied to one surface of the polyimide film and dried at 80° C.×40 min. The thickness of the dry film of the adhesive was 25 μm. Then, a polyimide film having an adhesive applied to the both surfaces of the core substrate was superimposed, tentative pressed with a vacuum laminater, and then pressed with a hot plate press heated to 150° C. at actual weight of 20 kgf/cm$^2$ for 30 min. A YAG laser was used for perforation. The via diameter was 150 μm. After perforation, a desmear treatment was performed. After washing with water, the entire surface of the substrate was plasma-treated and, after conditioning, catalyst addition and activation, 0.8 μm thick electroless copper plating was applied in a formalin reduction bath, electroplating for thickening and via fill plating were performed in a sulfuric acid copper plating bath, and the surface was buffed to ensure planarity, at which point the thickness of the copper foil was 15 μm. For formation of a pattern, a 25 μm thick dry film resist was laminated, exposed to light, developed and etched with a cupric chloride solution, then the resist was peeled off, and the substrate was washed with dilute sulfuric acid to give a conductor pattern with a thin line width of 70 μm.

<Solder Heat Resistance>

The second buildup layer was formed in the same manner as in the first buildup layer except that the adhesive to be applied to the polyimide film was 15 μm thick. By the above-mentioned steps, a multi-layer printed wire board having a total of 8 layers, with two buildup layers on each side, was obtained.

The obtained multi-layer printed wire board was immersed for 10 sec in a tin-copper-silver, lead-free solder tank heated to 280° C., and the presence or absence of peeling, swelling and the like was visually observed.

Then, the board was set on an ETAC (R) temperature cycle test apparatus (manufactured by Kusumoto Chemicals, Ltd.) and a heating-cooling cycle test wherein the board was heated and cooled every 30 min between a low temperature of −50° C. and a high temperature of 150° C. was performed for 100 hr. After the test, the board was immersed for 10 sec in a tin-copper-silver lead-free solder tank heated to 280° C., and the presence or absence of peeling, swelling and the like was visually observed.

<Contact Failure Rate>

A 7 mm×7 mm semiconductor chip was mounted on the obtained multi-layer printed wire board (25.4 mm×25.4 mm) by face-down bonding. The number of bondings was 256.

The package was set on an ETAC (R) temperature cycle test apparatus (manufactured by Kusumoto Chemicals, Ltd.) and a heating-cooling cycle test wherein the board was heated and cooled every 30 min between a low temperature of −50° C. and a high temperature of 150° C. was performed for 500 hr. After the test, the board was subjected to a conduction test, and a connection point failure rate was determined.

Examples 1-4, Comparative Examples 1-3

Production Example of Polyamide Acid Solution—1

A reaction container equipped with a nitrogen inlet tube, a thermometer and a stirring rod was purged with nitrogen, and 500 parts by mass of 5-amino-2-(p-aminophenyl)benzoxazole was placed therein. Then, 9000 parts by mass of N-methyl-2-pyrrolidone was added and, after complete dissolution, 485 parts by mass of pyromellitic acid dianhydride was added. The mixture was stirred at 25° C. for 50 hr to give a brown viscous polyamide acid solution. The reduced viscosity (ηsp/C) was 4.6 dl/g.

Production Example of Film—1

The polyamide acid solution was applied to a stainless belt (squeegee/belt gap was 650 μm) and dried at 90° C. for 60 min. After drying, a self-supporting polyamide acid film was peeled off from a stainless belt to give a green film having a thickness of 40 μm.

The obtained green film was passed through a nitrogen purged continuous type heat treatment furnace, and heated in two steps under the conditions described in Table 1 to carry out an imidation reaction. Thereafter, the film was cooled to room temperature over 5 min to give brown polyimide films of Examples 1-4 and Comparative Examples 1-3. The evaluation results of each polyimide films obtained are shown in Table 1.

released from a stainless belt to give a green film having a thickness of 40 μm. The amount of the residual solvent in the green film then was 35% by mass.

The obtained green film was passed through a continuous type drying furnace, and heat-treated at 170° C. for 3 min, after which the temperature was elevated to 450° C. at about 70° C./min, heat-treated at 450° C. for 10 min, cooled to room temperature over 5 min to give a brown polyimide film having

TABLE 1

| | | | Ex. 1 | Ex. 2 | Ex. 3 | Ex. 4 | Com. Ex. 1 | Com. Ex. 2 | Com. Ex. 3 |
|---|---|---|---|---|---|---|---|---|---|
| annealing conditions before | temperature | ° C. | 130 | 130 | 150 | 150 | 170 | — | 130 |
| imidation reaction treatment | time | min | 5 | 4 | 3 | 1 | 2 | — | 0.5 |
| | temperature rise | ° C./min | 1.0 | 0.6 | 1.5 | 1.3 | 1.8 | — | 0.7 |
| imidation conditions | first step temperature | ° C. | 200 | 170 | 200 | 170 | 200 | 170 | 130 |
| | time | min | 4 | 6 | 4 | 5 | 3 | 5 | 4 |
| | temperature rise | °C./min | 5 | 3 | 5 | 4 | 5 | 3 | 2 |
| | second step temperature | ° C. | 500 | 450 | 450 | 450 | 450 | 380 | 450 |
| | time | min | 2 | 7 | 6 | 5 | 5 | 10 | 5 |
| thickness | | μm | 25 | 25 | 25 | 25 | 25 | 25 | 25 |
| tensile elastic modulus | MD | GPa | 9 | 8.2 | 8 | 7.9 | 7.5 | 6.6 | 6.2 |
| | TD | GPa | 9 | 8 | 7.9 | 7.9 | 7.2 | 6.5 | 6.1 |
| tensile strength at break | MD | MPa | 400 | 360 | 370 | 350 | 350 | 310 | 280 |
| | TD | MPa | 390 | 350 | 360 | 340 | 310 | 290 | 250 |
| tensile elongation at break | MD | % | 25 | 28 | 29 | 32 | 30 | 47 | 58 |
| | TD | % | 24 | 26 | 28 | 30 | 27 | 44 | 55 |
| coefficient of linear thermal | MD | ppm/° C. | 5 | 8 | 8 | 10 | 12 | 17 | 24 |
| expansion | TD | ppm/° C. | 4 | 6 | 7 | 8 | 10 | 15 | 20 |
| melting point | | ° C. | none | none | none | none | none | none | none |
| glass transition temperature | | ° C. | none | none | none | none | none | none | none |
| thermal decomposition temperature | | ° C. | 620 | 610 | 600 | 590 | 610 | 590 | 590 |
| planar orientation coefficient | | — | 0.87 | 0.83 | 0.82 | 0.79 | 0.81 | 0.78 | 0.75 |
| density | | g/cm$^3$ | 1.53 | 1.51 | 1.49 | 1.48 | 1.46 | 1.46 | 1.45 |
| volume resistivity × 10$^{-16}$ | | Ωcm | 2.0 | 1.8 | 1.6 | 1.3 | 1.0 | 0.9 | 0.9 |
| dielectric breakdown voltage | | KV | 6.5 | 6.8 | 6.3 | 6.1 | 5.2 | 4.3 | 3.8 |
| dielectric constant ($\epsilon_{65}$) | 1 GHz | — | 2.8 | 2.9 | 3.1 | 3.1 | 3.2 | 3.2 | 3.3 |
| | 10 GHz | — | 2.7 | 2.8 | 3.0 | 3.0 | 3.0 | 3.1 | 3.2 |
| | 100 GHz | — | 2.7 | 2.8 | 2.9 | 3.0 | 3.0 | 3.1 | 3.2 |
| dielectric loss tangent | 1 GHz | — | 0.006 | 0.007 | 0.012 | 0.015 | 0.043 | 0.060 | 0.060 |
| | 10 GHz | — | 0.004 | 0.005 | 0.010 | 0.011 | 0.036 | 0.051 | 0.053 |
| | 100 GHz | — | 0.001 | 0.003 | 0.006 | 0.008 | 0.032 | 0.040 | 0.045 |

MD: longitudinal direction (machine direction)
TD: transverse direction

Example 5

Production Example of Polyamide Acid Solution—2

A reaction container equipped with a nitrogen inlet tube, a thermometer and a stirring rod was purged with nitrogen, and 5-amino-2-(p-aminophenyl)benzoxazole (formula 1, 450 parts by mass) and 5-amino-2-(m-aminophenyl)benzoxazole (formula 3, 50 parts by mass) were placed therein. Then, 9100 parts by mass of N,N-dimethylacetamide was added and, after complete dissolution, 485 parts by mass of pyromellitic acid dianhydride was added. The mixture was stirred at 25° C. for 40 hr to give a brown viscous polyamide acid solution A. The ηsp/C thereof was 4.0 dl/g.

Production Example of Film—2

The polyamide acid solution was applied to a stainless belt (squeegee/belt gap was 650 μm) and dried at 90° C. for 60 min. After drying, a self-supporting polyamide acid film was a thickness of 25 μm. The obtained polyimide film was evaluated for the properties. Using the obtained polyimide film, a buildup multi-layer wiring board was produced and the solder heat resistance and contact failure rate were evaluated. The respective evaluation results are shown in Table 2.

Example 6

In the same manner as in Example 5 except that the temperature profile of the heat treatment was as shown in Table 2, a polyimide film and a buildup multi-layer wiring board were obtained and subjected to similar evaluation. The results are shown in Table 2.

Comparative Examples 4, 5

Production Example of Polyamide Acid Solution—3

A reaction container equipped with a nitrogen inlet tube, a thermometer and a stirring rod was purged with nitrogen, and 5-amino-2-(p-aminophenyl)benzoxazole (formula 1, 450 parts by mass) and 5-amino-2-(m-aminophenyl)benzoxazole (formula 3, 50 parts by mass) were placed therein. Then, 9100 parts by mass of N-methylpyrrolidone was added and, after complete dissolution, 485 parts by mass of pyromellitic acid dianhydride was added. The mixture was stirred at 25° C. for 40 hr to give a brown viscous polyamide acid solution B. The ηsp/C thereof was 4.1 dl/g.

Production Example of Film—3

In the same manner as in Example 5 except that the temperature profile of the heat treatment was as shown in Table 2, a polyimide film and a buildup multi-layer wiring board were obtained using the obtained polyamide solution and subjected to similar evaluation. The evaluation results are shown in Table 2.

The solder heat resistance and contact failure of the polyimide films of Examples 5 and 6, wherein the amount of water evaporated at a high temperature was not more than 10000 ppm, were superior. However, in Comparative Examples 1 and 2, swelling was developed in the solder heat resistance test after the heating-cooling cycle test, and the contact failure rate was also high.

thyl-2-pyrrolidone was added and, after complete dissolution, 485 parts by mass of pyromellitic acid dianhydride was added. The mixture was stirred at 25° C. for 15 hr to give a brown viscous polyamide acid solution. The ηsp/C thereof was 4.0 dl/g.

Production Example of Film—4

The polyamide acid solution was applied to a stainless belt (squeegee/belt gap was 650 μm) and dried at 90° C. for 60 min. After drying, a self-supporting polyamide acid film was peeled off from a stainless belt to give a green film having a thickness of 40 μm. The amount of the residual solvent in the green film was 39%.

The obtained green film was passed through a continuous type drying furnace, and heat-treated at 170° C. for 3 min, after which the temperature was elevated to 450° C. at about 70° C./min, the film was heat-treated at 450° C. for 10 min and cooled to room temperature over 5 min to give a brown polyimide film having a thickness of 25 μm. The properties of the obtained polyimide film were evaluated. A buildup multi-layer wiring board was produced using the obtained polyimide film, and evaluated for the solder heat resistance and

TABLE 2

| | | | Ex. 5 | Ex. 6 | Com. Ex. 4 | Com. Ex. 5 |
|---|---|---|---|---|---|---|
| solvent of polyamide acid dope | | | DMAc | DMAc | NMP | DMAc |
| amount of residual solvent GF | | % by mass | 35 | 32 | 38 | 41 |
| heat treatment | temperature at start | ° C. | 170 | 200 | 170 | 200 |
| | temperature rise rate | ° C./min | 70 | 60 | 70 | 60 |
| | temperature reached | ° C. | 450 | 480 | 450 | 380 |
| | dwelling time | min | 10 | 15 | 3 | 30 |
| thickness | | μm | 25 | 25 | 25 | 25 |
| tensile strength at break | MD | MPa | 350 | 380 | 290 | 330 |
| | TD | MPa | 340 | 370 | 280 | 310 |
| tensile elastic modulus | MD | GPa | 7.8 | 9.4 | 4 | 7.3 |
| | TD | GPa | 7.8 | 9.3 | 3.8 | 7 |
| tensile elongation at break | MD | % | 32 | 26 | 61 | 49 |
| | TD | % | 33 | 27 | 57 | 46 |
| coefficient of linear thermal | MD | ppm | 6 | 3 | 23 | 19 |
| expansion | TD | ppm | 4 | 4 | 21 | 17 |
| melting point | | ° C. | none | none | none | none |
| glass transition temperature | | ° C. | none | none | none | none |
| thermal decomposition temperature | | ° C. | 610 | 623 | 585 | 610 |
| amount of water evaporated at high temperature | | ppm | 4500 | 2300 | 12000 | 23000 |
| $\epsilon_D$ (dry, 100 Hz) | | — | | 2.9 | 2.7 | 3.1 | 3.2 |
| $\epsilon_{65}$ (humidity conditioned, 100 Hz) | | — | 3.0 | 2.8 | 3.5 | 3.7 |
| $\epsilon_{65}/\epsilon_D$ | | — | 1.03 | 1.04 | 1.13 | 1.16 |
| solder heat resistance | after temperature cycle | | good | good | swelling occurred | swelling occurred |
| contact failure rate | after temperature cycle | | 5.2 | 4.3 | 97 | 0.5 |

NMP: N-methyl-2-pyrrolidone
DMAc: N,N-dimethylacetamide
MD: longitudinal direction (machine direction)
TD: transverse direction Example 7

Production Example of Polyamide Acid Solution—4

A reaction container equipped with a nitrogen inlet tube, a thermometer and a stirring rod was purged with nitrogen, and 500 parts by mass of 5-amino-2-(p-aminophenyl)benzoxazole was placed therein. Then, 9000 parts by mass of N-mecontact failure rate. The respective evaluation results are shown in Table 3.

Example 8, Comparative Examples 6, 7

In the same manner as in Example 7 except that the temperature profile of the heat treatment was as shown in Table 3, polyimide films and buildup multi-layer wiring boards were obtained and subjected to similar evaluation. The evaluation results are shown in Table 3.

TABLE 3

|  |  |  | Ex. 7 | Ex. 8 | Com. Ex. 6 | Com. Ex. 7 |
|---|---|---|---|---|---|---|
| amount of residual solvent GF |  | % by mass | 39 | 33 | 35 | 42 |
| imidation conditions | temperature at start | °C. | 170 | 200 | 170 | 200 |
|  | temperature rise rate | °C./min | 70 | 60 | 70 | 60 |
|  | temperature reached | °C. | 450 | 420 | 450 | 380 |
|  | dwelling time | min | 10 | 15 | 3 | 30 |
| thickness |  | μm | 25 | 25 | 25 | 25 |
| tensile elastic modulus | MD | GPa | 7.9 | 9.5 | 4.1 | 7.5 |
|  | TD | GPa | 7.9 | 9.4 | 3.9 | 7.2 |
| tensile strength at break | MD | MPa | 360 | 370 | 300 | 350 |
|  | TD | MPa | 340 | 360 | 280 | 310 |
| tensile elongation at break | MD | % | 30 | 25 | 58 | 47 |
|  | TD | % | 31 | 24 | 55 | 44 |
| coefficient of linear thermal expansion | MD | ppm | 5 | 4 | 24 | 17 |
|  | TD | ppm | 3 | 3 | 20 | 15 |
| melting point |  | °C. | none | none | none | none |
| glass transition temperature |  | °C. | none | none | none | none |
| thermal decomposition temperature |  | °C. | 610 | 625 | 590 | 620 |
| amount of water evaporated at high temperature |  | ppm | 4800 | 2200 | 12000 | 23000 |
| solder heat resistance (after temperature cycle) |  |  | good | good | swelling occurred | swelling occurred |
| contact failure rate (after temperature cycle) |  |  | 5.2 | 4.3 | 97 | 0.5 |

MD: longitudinal direction (machine direction)
TD: transverse direction (Examples 9-10, Comparative Examples 8-10)

In the same manner as in Example 7 except that the obtained green film was passed through a nitrogen purged continuous type heat treatment furnace, and heated in two steps under the conditions described in Table 4 to carry out an imidation reaction, a polyimide film was obtained and subjected to the evaluation in the same manner. The evaluation results are shown in Table 4.

TABLE 4

|  |  |  |  | Ex. 9 | Ex. 10 | Com. Ex. 8 | Com. Ex. 9 | Com. Ex. 10 |
|---|---|---|---|---|---|---|---|---|
| imidation conditions | first step | temperature | °C. | 170 | 200 | 170 | 200 | 130 |
|  |  | time | min | 3 | 2 | 3 | 1 | 3 |
|  |  | temperature rise | °C./min | 3 | 6 | 0.5 | 3 | 2 |
|  | second step | temperature | °C. | 450 | 500 | 380 | 380 | 450 |
|  |  | time | min | 7 | 1 | 5 | 10 | 5 |
| thickness |  |  | μm | 25 | 25 | 25 | 25 | 25 |
| tensile elastic modulus |  | MD | GPa | 7.9 | 9.0 | 4.1 | 7.5 | 6.2 |
|  |  | TD | GPa | 7.9 | 9.0 | 3.9 | 7.2 | 6.1 |
| tensile strength at break |  | MD | MPa | 350 | 380 | 300 | 350 | 280 |
|  |  | TD | MPa | 340 | 370 | 280 | 310 | 250 |
| tensile elongation at break |  | MD | % | 25 | 25 | 58 | 47 | 20 |
|  |  | TD | % | 24 | 24 | 55 | 44 | 15 |
| coefficient of linear thermal expansion |  | MD | ppm | 6 | 5 | 24 | 17 | 12 |
|  |  | TD | ppm | 5 | 4 | 20 | 15 | 10 |
| melting point |  |  | °C. | none | none | none | none | none |
| glass transition temperature |  |  | °C. | none | none | none | none | none |
| thermal decomposition temperature |  |  | °C. | 610 | 620 | 590 | 620 | 590 |
| planar orientation coefficient |  |  | — | 0.82 | 0.87 | 0.75 | 0.78 | 0.77 |
| volume resistivity |  |  | $\times 10^{16}$ Ωcm | 1.5 | 2.0 | 0.9 | 1.0 | 1.0 |
| dielectric breakdown voltage |  |  | KV | 6.8 | 6.5 | 4.2 | 3.8 | 5.1 |
| dielectric constant ($\epsilon_{65}$) |  | 1 GHz | — | 3.0 | 2.8 | 3.2 | 3.1 | 3.2 |
|  |  | 10 GHz | — | 2.9 | 2.7 | 3.0 | 3.0 | 3.1 |
|  |  | 100 GHz | — | 2.8 | 2.7 | 2.9 | 2.9 | 3.1 |
| dielectric loss tangent |  | 1 GHz | — | 0.008 | 0.006 | 0.060 | 0.041 | 0.060 |
|  |  | 10 GHz | — | 0.006 | 0.004 | 0.058 | 0.035 | 0.051 |
|  |  | 100 GHz | — | 0.002 | 0.001 | 0.050 | 0.032 | 0.045 |

MD: longitudinal direction (machine direction)
TD: transverse direction

(Example 11)

<Preparation Example of polyamide acid solution -5>

A polyamide acid solution was obtained by a method similar to that in Example 7.

<Production Example of film-5>

The polyamide acid solution was applied to a stainless belt (squeegee/belt gap was 650μm) and dried in three hot air type drying zones at 90° C×20min, 90° C×20 min and 90° C×20min.

After drying, a self-supporting polyamide acid film was peeled off from a stainless belt to give a green film having a thickness of 40 μm. The obtained green film was passed through a continuous type drying furnace, and heat-treated at 170° C. for 3min, after which the temperature was elevated to 450° C. over about 20 seconds, the film was heat-treated at 450° C. for 7 min and cooled to room temperature over 5 min to give a brown polyimide film having a thickness of 25μm. The properties of the obtained polyimide film are shown in Table 5.

(Examples 12, 13, Comparative Examples 11-14)

In the same manner as in Example 11 except that a polyamide acid solution was applied to a stainless belt and temperaturex time of the three hot air type drying zones was as shown in Table 5, a green film was obtained, which was then heat treated in the same manner as in Example 11 to give a polyimide film.

The property values of the polyimide films of Examples 12 and 13 are shown in Table 5, and the property values of the polyimide films of Comparative Examples 11-14 are shown in Table 6.

TABLE 5

|  |  |  | Ex. 11 | Ex. 12 | Ex. 13 |
|---|---|---|---|---|---|
| green film production | temperature-1 | ° C. | 90 | 90 | 110 |
|  | temperature-2 | ° C. | 90 | 100 | 110 |

TABLE 5-continued

|  |  |  | Ex. 11 | Ex. 12 | Ex. 13 |
|---|---|---|---|---|---|
| conditions | temperature-3 | ° C. | 90 | 120 | 110 |
|  | time (1-3) | min | 20 each | 10 each | 10 each |
| amount of residual solvent of GF | | % by mass | 41.7 | 35.1 | 35.3 |
| thickness | | μm | 24 | 25 | 25 |
| tensile elastic modulus | | GPa | 6.8 | 6.4 | 7.2 |
| tensile strength at break | | MPa | 450 | 480 | 500 |
| tensile elongation at break | | % | 35 | 31 | 30 |
| coefficient of linear thermal expansion | | ppm | 3 | 2 | 4 |
| melting point | | ° C. | none | none | none |
| glass transition temperature | | ° C. | none | none | none |
| surface planar orientation degree | surface B | | — | 8.772 | 8.000 | 7.813 |
|  | surface A | | — | 9.615 | 8.929 | 9.259 |
| difference in surface planar orientation degree |A-B| | | | — | 0.843 | 0.929 | 1.446 |
| curling degree | | mm | 1.0 | 1.2 | 1.5 |
|  | | % | 2.8 | 3.4 | 4.2 |

MD: longitudinal direction (machine direction)
TD: transverse direction

TABLE 6

|  |  |  | Com. Ex. 11 | Com. Ex. 12 | Com. Ex. 13 | Com. Ex. 14 |
|---|---|---|---|---|---|---|
| green film production conditions | temperature-1 | ° C. | 100 | 130 | 120 | 150 |
|  | temperature-2 | ° C. | 120 | 130 | 140 | 150 |
|  | temperature-3 | ° C. | 130 | 130 | 150 | 150 |
|  | time (1-3) | min | 10 | 10 | 5 | 5 |
| amount of residual solvent of GF | | % by mass | 32.0 | 30.4 | 24.7 | 23.5 |
| thickness | | μm | 24 | 25 | 25 | 24 |
| tensile elastic modulus | | GPa | 6.5 | 5.8 | 5.5 | 5 |
| tensile strength at break | | MPa | 420 | 350 | 360 | 320 |
| tensile elongation at break | | % | 27 | 15 | 12 | 5 |
| coefficient of linear thermal expansion | | ppm | 3 | 15 | 12 | 38 |
| melting point | | ° C. | none | none | none | none |
| glass transition temperature | | ° C. | none | none | none | none |
| surface planar orientation degree | surface B | — | 5.882 | 4.762 | 3.704 | 4.000 |
|  | surface A | — | 9.091 | 7.143 | 6.250 | 7.692 |
| difference in surface planar orientation degree |A-B| | | — | 3.209 | 2.381 | 2.546 | 3.692 |
| curling degree | | mm | 6.0 | 10.0 | >10 | >10 |
|  | | % | 17.0 | 28.0 | >28 | >28 |

MD: longitudinal direction (machine direction)
TD: transverse direction

The film of the present invention shows lower loss and faster response speed (good rise of pulse signals) at high frequency as compared to conventionally known polyimide films. Therefore, the film is useful as a substrate film for the production of copper-adhered substrates for flexible print circuit (FPC) used for high frequency electronics, a carrier tape for tape automated bonding (TAB) and the like. In addition, the film shows a small difference in dielectric constant between a dry state and a wet state, the amount of water evaporated at a high temperature is extremely small and the development of swelling and delamination can be prevented when used at a high temperature. Therefore, the film is useful as a substrate film of a substrate used for electronics required to show high reliability.

The polyimide film of the present invention is an unprecedented polyimide film superior in thermal degradation stability, which has a curling degree of not more than 5%, and shows high rigidity, high strength and high heat resistance like the conventional polyimide films. Therefore, the film is preferably used as a substrate film for the production of copper-adhered substrates for flexible print circuit (FPC) with strict dimensional precision requirements, a carrier tape for tape automated bonding (TAB) and the like.

The invention claimed is:

1. A polyimide film obtained by reacting an aromatic diamine having a benzoxazole structure with an aromatic tetracarboxylic acid anhydride, which film has a planar orientation coefficient of 0.79-0.89 as measured by an X-ray diffraction method and a dielectric constant of 2.7-3.1 at 100 GHz as measured by a cavity resonance perturbation method.

2. The polyimide film of claim 1, having a dielectric loss tangent at 100 GHz of 0.0001-0.03 as measured by the cavity resonance perturbation method.

3. The polyimide film of claim 1, having dielectric constants of 2.7-3.1 at 1 GHz and 2.6-3.0 at 100 GHz, as measured by the cavity resonance perturbation method.

4. The polyimide film of claim 1, which has a density of 1.47 g/cm$^3$-1.55 g/cm$^3$.

5. A polyimide film obtained by reacting an aromatic diamine having a benzoxazole structure with an aromatic tetracarboxylic acid anhydride to produce a polyamide acid solution, drying the polyamic acid solution to produce a self-supporting green polyamide acid film, passing the green film through a nitrogen purged continuous type heat treatment furnace to heat the green film to carry out an imidation reaction and cooling the produced film to room temperature to give the polyimide film,
wherein the amount of water vaporized at a high temperature during heating at 500° C. for 10 sec of the film immediately after helium purge at 170° C. for 7 min and preliminary drying is not more than 5000 ppm.

6. The polyimide film of claim 1, wherein the ratio ($\epsilon_{65}/\epsilon_D$) of the dielectric constant $\epsilon_{65}$ at 100 GHz of the film humidity-conditioned under a constant temperature and humidity conditions of 20° C., 65% RH for 94 hr, as measured by the cavity resonance perturbation method, to the dielectric constant $\epsilon_D$ at 100 GHz of the film vacuum dried under the conditions of 120° C., for 24 hr, as measured by the cavity resonance perturbation method, is within the range of 1.00-1.10.

7. A polyimide film obtained by reacting an aromatic diamine having a benzoxazole structure with an aromatic tetracarboxylic acid anhydride, wherein the absolute value of the difference between a surface planar orientation degree of one surface (surface A) and a surface planar orientation degree of the other surface (surface B) of the film is 0-2.

8. The polyimide film of claim 7, wherein the surface planar orientation degree of the film surface having a higher surface planar orientation degree is not more than 15.

9. The polyimide film of claim 7, which has a curling degree of 0%-5%.

10. A base substrate for printed wiring assemblies, which comprises the polyimide film of claim 1.

11. The polyimide film of claim 2, having dielectric constants of 2.7-3.1 at 1 GHz and 2.6-3.0 at 100 GHz, as measured by the cavity resonance perturbation method.

12. The polyimide film of claim 2, which has a density of 1.47 g/cm$^3$-1.55 g/cm$^3$.

13. The polyimide film of claim 7, wherein the ratio ($\epsilon_{65}/\epsilon_D$) of the dielectric constant $\epsilon_{65}$ at 100 GHz of the film humidity-conditioned under a constant temperature and humidity conditions of 20° C., 65% RH for 94 hr, as measured by the cavity resonance perturbation method, to the dielectric constant $\epsilon D$ at 100 GHz of the film vacuum dried under the conditions of 120° C., for 24 hr, as measured by the cavity resonance perturbation method, is within the range of 1.00-1.10.

14. The polyimide film of claim 8, which has a curling degree of 0%-5%.

15. A base substrate for printed wiring assemblies, which comprises the polyimide film of claim 4.

16. A base substrate for printed wiring assemblies, which comprises the polyimide film of claim 5.

17. A base substrate for printed wiring assemblies, which comprises the polyimide film of claim 7.

* * * * *